(12) United States Patent
Kim et al.

(10) Patent No.: US 12,328,107 B2
(45) Date of Patent: Jun. 10, 2025

(54) PACKAGED POWER AMPLIFIER DEVICE WITH AIR CAVITY OVER DIE

(71) Applicant: NXP USA, Inc., Austin, TX (US)

(72) Inventors: Kevin Kim, Chandler, AZ (US); Vikas Shilimkar, Chandler, AZ (US); Joseph Gerard Schultz, Wheaton, IL (US)

(73) Assignee: NXP USA, INC., Austin, TX (US)

( * ) Notice: Subject to any disclaimer, the term of this patent is extended or adjusted under 35 U.S.C. 154(b) by 515 days.

(21) Appl. No.: 17/823,122

(22) Filed: Aug. 30, 2022

(65) Prior Publication Data

US 2024/0072739 A1 Feb. 29, 2024

(51) Int. Cl.
| | |
|---|---|
| H03F 3/195 | (2006.01) |
| H01L 23/66 | (2006.01) |
| H03F 1/02 | (2006.01) |
| H03F 3/24 | (2006.01) |

(52) U.S. Cl.
CPC ............ *H03F 3/245* (2013.01); *H01L 23/66* (2013.01); *H03F 1/0288* (2013.01); *H03F 3/195* (2013.01); *H01L 2223/6611* (2013.01); *H01L 2223/6655* (2013.01); *H03F 2200/451* (2013.01)

(58) Field of Classification Search
CPC .................................. H03F 3/195; H03F 1/02
USPC ..................... 330/307, 124 R, 295
See application file for complete search history.

(56) References Cited

U.S. PATENT DOCUMENTS

| | | | |
|---|---|---|---|
| 6,724,079 B2 | 4/2004 | Viswanathan et al. |
| 6,844,221 B2 | 1/2005 | Viswanathan et al. |
| 9,013,246 B2 | 4/2015 | Holmes et al. |
| 9,202,782 B2 | 12/2015 | Chuah |
| 9,252,085 B2 | 2/2016 | Weinschenk |
| 9,986,646 B2 | 5/2018 | Viswanathan et al. |
| 10,784,149 B2 | 9/2020 | Costa et al. |
| 10,903,182 B1 | 1/2021 | Wang et al. |
| 11,190,146 B2 | 11/2021 | Srinidhi Embar et al. |
| 2002/0074146 A1 | 6/2002 | Okubora |
| 2003/0165052 A1 | 9/2003 | Negishi et al. |
| 2008/0315398 A1 | 12/2008 | Lo et al. |
| 2010/0155931 A1 | 6/2010 | Ray et al. |

(Continued)

FOREIGN PATENT DOCUMENTS

| | | |
|---|---|---|
| EP | 3376535 A1 | 9/2018 |
| EP | 3982406 A2 | 4/2022 |

OTHER PUBLICATIONS

U.S. Appl. No. 17/823,116, filed Aug. 30, 2022, 53 pages.

(Continued)

*Primary Examiner* — Henry Choe
(74) *Attorney, Agent, or Firm* — Sherry W. Gourlay

(57) ABSTRACT

A power amplifier device includes a substrate formed from a stack of alternating dielectric and patterned conductive layers and conductive vias electrically connecting the patterned conductive layers. The substrate has a set of substrate die contacts exposed at a first substrate surface, and an air cavity extending into the substrate through a portion of the first substrate surface that is located between the set of substrate die contacts. A power transistor die has first and second die contacts at a first die surface, which are connected to the substrate die contacts. The power transistor die also includes an integrated transistor in an active area of the die. The integrated transistor includes a control terminal coupled to the first die contact, and a first current conducting terminal coupled to the second die contact. The active area is aligned with the first air cavity.

21 Claims, 15 Drawing Sheets

(56) References Cited

U.S. PATENT DOCUMENTS

| | | |
|---|---|---|
| 2018/0159479 A1 | 6/2018 | Wu et al. |
| 2020/0203291 A1 | 6/2020 | Uejima |
| 2021/0111091 A1 | 4/2021 | Uppal et al. |
| 2021/0175854 A1 | 6/2021 | Hue et al. |
| 2021/0313282 A1 | 10/2021 | Noori et al. |
| 2021/0313284 A1 | 10/2021 | Noori et al. |
| 2021/0313285 A1 | 10/2021 | Noori et al. |
| 2021/0313293 A1 | 10/2021 | Noori et al. |
| 2022/0115301 A1 | 4/2022 | Bowers et al. |

OTHER PUBLICATIONS

U.S. Appl. No. 17/823,127, filed Aug. 30, 2022, 62 pages.
U.S. Appl. No. 18/054,971, filed Nov. 14, 2022, 74 pages.
Dinulovic et al.: "Power Microtransformer on Silicon Embedded into PCB", 2021 Third International Symposium on 3D Power Electronics Integration and Manufacturing (3D-PEIM), Conference Paper—Publisher: IEEE, 2021, 4 pages.
Kuo et al: "High Efficiency Power Electronic Module with Embedded Die", 2016 IEEE CPMT Symposium Japan (ICSJ), Conference Paper, Publisher IEEE, 2016, 4 pages.
Mark Lapedus "Embedded Die Packaging Emerges", Semiconductor Engineering, Apr. 9, 2018, 15 pages.
U.S. Appl. No. 17/823,116 Notice of Allowance issued on Apr. 4, 2025, 7 pages.

PACKAGED POWER AMPLIFIER DEVICE WITH AIR CAVITY OVER DIE

TECHNICAL FIELD OF THE INVENTION

The present invention relates generally to power amplifiers that are packaged in semiconductor device packages.

BACKGROUND OF THE INVENTION

Wireless communication systems employ power amplifiers for increasing the power of radio frequency (RF) signals. Power amplifiers may be implemented in various ways, with a majority of power amplifiers being implemented on a printed circuit board (PCB). Circuit board implementations of power amplifiers may include, for example, input/output (I/O) connectors (e.g., coax connectors), surface mount components (e.g., active and passive devices) coupled to the surface of the PCB, and printed traces on the PCB that interconnect the connectors and the surface mount components.

In some cases, the primary amplification portion of the power amplifier includes a bare transistor die that is connected to a PCB. In some cases, the die and PCB may be overmolded with plastic encapsulant to protect the die and other components from the environment. Unfortunately, however, the PCB material and/or the plastic encapsulation may result in significant degradation in the performance of the die, and thus may result in performance degradation for the amplifier as a whole. Accordingly, power amplifier designs are needed that overcome these issues.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
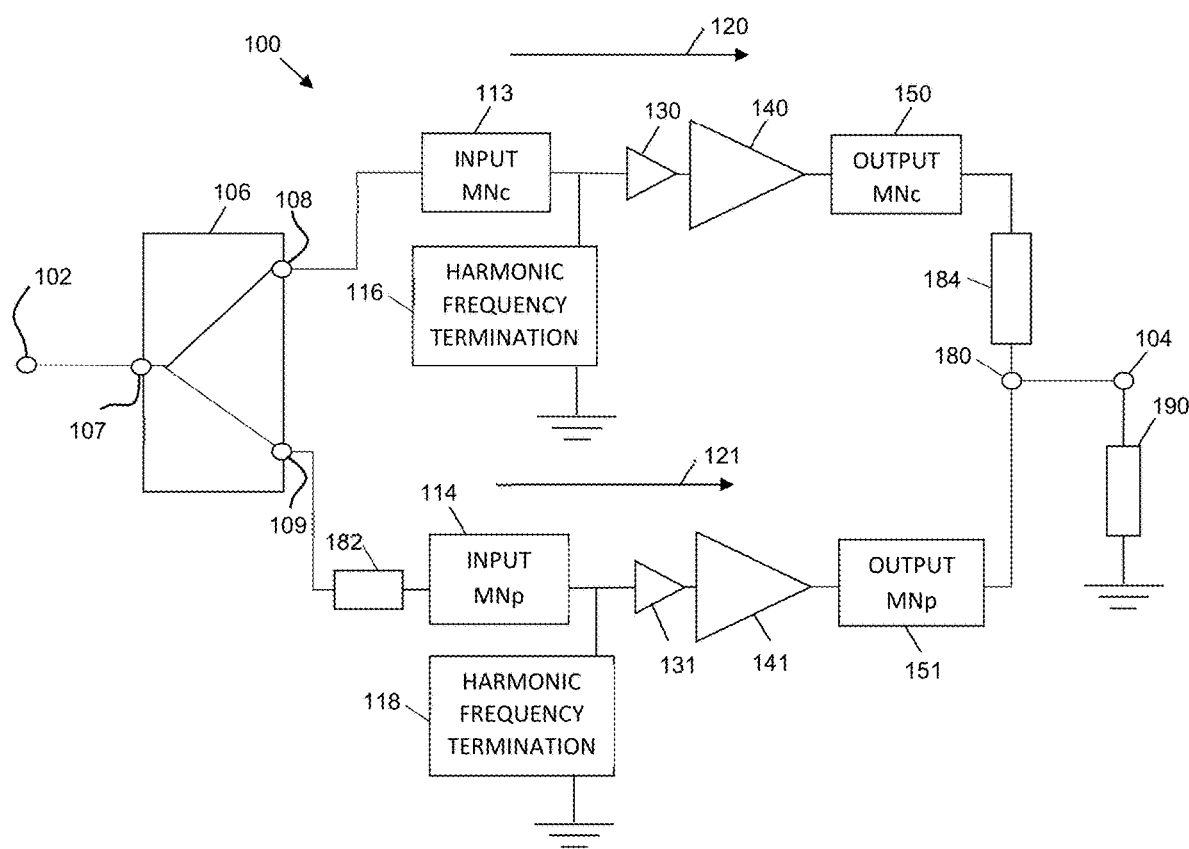
FIG. 1 is a simplified circuit diagram of a multi-path power amplifier, according to an embodiment.

Embodiments of power amplifiers described herein reduce or eliminate wirebond arrays from the amplifier circuits. This may provide for increased amplifier power and efficiency, and minimized inductances that may enable compliance with higher band specifications. Further, embodiments of power amplifier devices described herein include at least one power transistor die that is coupled to a substrate over an air cavity that extends into the substrate. The air cavity may produce the beneficial result of reducing parasitic impacts (e.g., performance degradation of active and passive circuits), which otherwise may result from the proximity of the die to the substrate material. In addition, embodiments of power amplifiers described herein may facilitate miniaturization of RF amplifiers, which increasingly is becoming a critical aspect of power amplifier designs. Further still, in embodiments in which wirebond arrays are eliminated completely, the expensive wirebond assembly steps and wirebonder equipment may be eliminated.

An embodiment of a power amplifier device includes a substrate formed from a stack of alternating dielectric and patterned conductive layers. The substrate has a set of substrate die contacts exposed at a first substrate surface, and an air cavity extending into the substrate through a portion of the first substrate surface that is located between the set of substrate die contacts. A power transistor die has first and second die contacts at a first die surface, which are connected to the substrate die contacts. The power transistor die also includes an integrated transistor in an active area of the die. The integrated transistor includes a control terminal coupled to the first die contact, and a first current conducting terminal coupled to the second die contact. The active area is aligned with the first air cavity.

The power amplifier device embodiments described herein may be used to implement various types of amplifiers. Embodiments may be well suited for amplifiers that include a single power transistor die or multiple power transistor dies, each associated with an amplification stage (e.g., amplifiers with a series-coupled pre-amplifier and final stage amplifier). The embodiments also may be particularly well suited for multiple-path amplifiers (e.g., a multi-path amplifier with a main amplifier (or primary or carrier amplifier) and one or more auxiliary amplifiers (e.g., a peaking amplifier) implemented in series or parallel) and/or for amplifiers with transistor dies that generate high heat. For purpose of example, some of the below-described embodiments will be described in the context of a Doherty power amplifier, which is one non-limiting example of a multi-path amplifier in which the invention may be practiced. In fact, use of the below-described embodiments to provide a Doherty power amplifier may result in significant improvements in Doherty power amplifier performance and/or significantly reduced size. A schematic of a Doherty power amplifier will be described next in order to provide adequate context for the description of the various embodiments.

FIG. 1 is a simplified schematic diagram of a multiple-path power amplifier, and more specifically, a Doherty power amplifier 100, which may be embodied in an embodiment of an amplifier device, discussed later. Amplifier 100 includes an input terminal 102, an output terminal 104, a power divider 106 (or splitter), a carrier amplifier path 120, a peaking amplifier path 121, and a combining node 180. A load 190 may be coupled to the combining node 180 (e.g., through the output terminal 104 and an impedance transformer, not shown) to receive an amplified RF signal from amplifier 100.

Power divider 106 includes an input terminal 107 and two output terminals 108, 109. An input RF signal received at the amplifier input terminal 102 is conveyed to the input terminal 107 of the power divider 106, which divides the power of the input RF signal into carrier and peaking portions of the input signal. The carrier input signal is provided to the carrier amplifier path 120 at power divider output 108, and the peaking input signal is provided to the peaking amplifier path 121 at power divider output 109. During operation in a full-power mode when both the carrier and peaking amplifiers 140, 141 are supplying current to the load 190, the power divider 106 divides the input signal power between the amplifier paths 120, 121. For example, the power divider 106 may divide the power equally, such that roughly one half of the input signal power is provided to each path 120, 121 (e.g., for a symmetric Doherty amplifier configuration). Alternatively, the power divider 106 may divide the power unequally (e.g., for an asymmetric Doherty amplifier configuration).

Essentially, the power divider 106 divides an input RF signal supplied at the input terminal 102 into carrier and peaking signals, and the carrier and peaking signals are separately amplified along the carrier and peaking amplifier paths 120, 121, respectively. The amplified carrier and peaking signals are then combined in phase at the combining node 180. It is important that phase coherency between the carrier and peaking amplifier paths 120, 121 is maintained across a frequency band of interest to ensure that the amplified carrier and peaking signals arrive in phase at the combining node 180, and thus to ensure proper Doherty amplifier operation.

Each of the carrier amplifier and peaking amplifier paths 120, 121 includes one or more single-stage or multiple-stage power transistor integrated circuits (ICs) (or power transistor dies) for amplifying the RF signals conducted through the amplifier path. As shown in FIG. 1, the carrier amplifier path 120 includes a two-stage amplifier, which includes a pre-amplifier stage 130 and a final amplifier stage 140 (referred to collectively as the carrier amplifier 130, 140). Similarly, the peaking amplifier path 121 includes a two-stage amplifier, which includes a pre-amplifier stage 131 and a final amplifier stage 141 (referred to collectively as the peaking amplifier 131, 141). In each path, the pre-amplifier and final amplifier stages may be integrated into a single power transistor IC, or the pre-amplifier and final amplifier stages may be integrated into two separate power transistor ICs. According to various embodiments, all amplifier stages or a final amplifier stage of either or both the carrier amplifier 130, 140 and/or the peaking amplifier 131, 141 may be implemented, for example, using a III-V field effect transistor (e.g., a HEMT), such as a gallium nitride (GaN) field effect transistor (FET) (or another type of III-V transistor, including a GaAs FET, a GaP FET, an InP FET, or an InSb FET). Where only one stage of the carrier amplifier 130, 140 or one stage of the peaking amplifier 131, 141 is implemented as a III-V FET, the other amplifier stage may be implemented as a silicon-based FET (e.g., an LDMOS FET) or a silicon germanium (SiGe) FET, in some embodiments. In still other embodiments, some or all of the amplifier stages may be implemented using silicon-based LDMOS (laterally diffused metal oxide semiconductor) transistors, SiGe transistors, or other types of transistors.

Although the carrier and peaking power transistor ICs may be of equal size (e.g., in a symmetric Doherty configuration), the carrier and peaking power transistor ICs may have unequal sizes, as well (e.g., in various asymmetric Doherty configurations). In an asymmetric Doherty configuration, the peaking power transistor IC(s) typically are larger than the carrier power transistor IC(s) by some multiplier. For example, the peaking power transistor IC(s) may be twice the size of the carrier power transistor IC(s) so that the peaking power transistor IC(s) have twice the current carrying capability of the carrier power transistor IC(s). Peaking-to-main amplifier IC size ratios other than a 2:1 ratio may be implemented, as well.

During operation of Doherty amplifier 100, the carrier amplifier 130, 140 is biased to operate in class AB mode, and the peaking amplifier 131, 141 is biased to operate in class C mode. At low power levels, where the power of the input signal at terminal 102 is lower than the turn-on threshold level of peaking amplifier 131, 141, the amplifier 100 operates in a low-power (or back-off) mode in which the carrier amplifier 130, 140 is the only amplifier supplying current to the load 190. When the power of the input signal exceeds a threshold level of the peaking amplifier 131, 141, the amplifier 100 operates in a high-power mode in which the carrier amplifier 130, 140 and the peaking amplifier 131, 141 both supply current to the load 190. At this point, the peaking amplifier 131, 141 provides active load modulation at combining node 180, allowing the current of the carrier amplifier 130, 140 to continue to increase linearly.

Optionally, input and output impedance matching networks 113, 150 (input MNc, output MNc) may be implemented at the input and/or output of the carrier amplifier 130, 140. Similarly, input and output impedance matching networks 114, 151 (input MNp, output MNp) optionally may be implemented at the input and/or output of the peaking amplifier 131, 141. In each case, the matching networks 113, 114, 150, 151 may be used to transform the gate and drain impedances of carrier amplifier 130, 140 and peaking amplifier 131, 141 to a more desirable system level impedance, as well as manipulate the signal phases to ensure proper Doherty amplifier operation. In various embodiments, all or portions of the input and output impedance matching networks 113, 114, 150, 151, if included, may be implemented inside a power amplifier package that includes the carrier and/or peaking amplifiers 140, 141.

In addition, embodiments of packaged amplifiers may include harmonic frequency termination circuits 116, 118 coupled between the inputs of amplifiers 140, 141 and a ground reference. In addition or alternatively, packaged amplifiers may include harmonic frequency termination circuits coupled between the outputs of amplifiers 140, 141 and a ground reference. Either way, the harmonic frequency termination circuits 116, 118 are configured to control the harmonic impedance across a relatively wide fractional bandwidth. For example, the harmonic frequency termination circuits 116, 118 may provide a low impedance path to ground for signal energy at the second harmonic of the center frequency of operation, fo, of the amplifier 100 (also referred to herein as the "fundamental frequency" of operation).

Doherty amplifier 100 has a "non-inverted" load network configuration. In the non-inverted configuration, the input circuit is configured so that an input signal supplied to the peaking amplifier 131, 141 is delayed by 90 degrees with respect to the input signal supplied to the carrier amplifier 130, 140 at the center frequency of operation, fo, of the amplifier 100. To ensure that the carrier and peaking input RF signals arrive at the carrier and peaking amplifiers 140, 141 with about 90 degrees of phase difference, as is fundamental to proper Doherty amplifier operation, phase delay element 182 applies about 90 degrees of phase delay to the peaking input signal. For example, phase delay element 182 may include a quarter wave transmission line, or another suitable type of delay element with an electrical length of about 90 degrees.

The 90 degree phase delay difference between the carrier and peaking amplifier paths 120, 121 at the inputs of amplifiers 140, 141 compensates for a 90 degree phase delay applied to the signal between the output of carrier amplifier 130, 140 and the combining node 180 (i.e., to ensure that the amplified signals arrive in phase at the combining node 180). This is achieved through an additional delay element 184, which also is configured to perform an impedance inversion (i.e., element 184 may be referred to as a phase delay/impedance inversion element). Alternate embodiments of Doherty amplifiers may have an "inverted" load network configuration. In such a configuration, the input circuit is configured so that an input signal supplied to the carrier amplifier 130, 140 is delayed by about 90 degrees with respect to the input signal supplied to the peaking amplifier 131, 141 at the center frequency of operation, fo, of the amplifier 100. Additionally, the output circuit is configured so that an output signal supplied to the combining node 180 by the peaking amplifier 131, 141 is delayed by about 90 degrees with respect to the main amplifier 130, 140 at the center frequency of operation, fo, of the amplifier 100.

Amplifiers 140 and 141, splitter 106, harmonic frequency termination circuits 116, 118, matching networks 113, 114, 150, 151, and delay elements 182, 184 all may be implemented in a discrete, packaged power amplifier device, in accordance with various embodiments. In such devices, the input and output terminals 102, 104 are coupled to corresponding pads on a system substrate (e.g., a PCB). The harmonic frequency termination circuits 116, 118 and the input and output matching networks 113, 114, 150, 151 also may be implemented as additional components within the packaged amplifier. Baseband decoupling circuits, bias circuits, and other circuits also may be implemented as additional components within the packaged amplifier device.

Figure 2A:
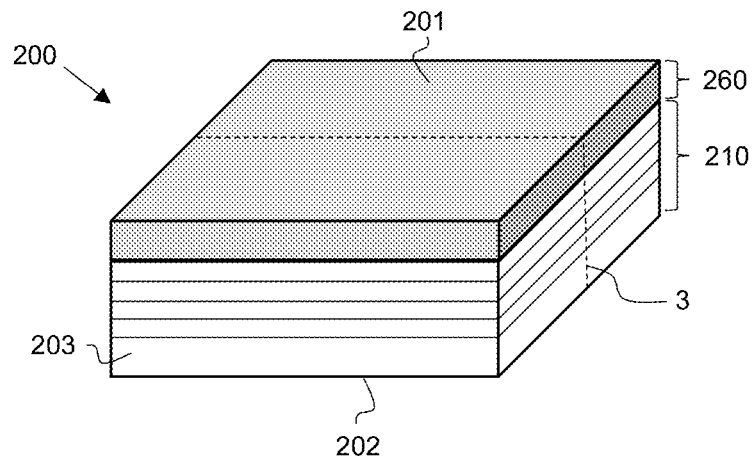
FIGS. 2A and 2B are perspective views showing the top and bottom surfaces, respectfully, of a power amplifier device, according to an example embodiment.
Figure 2B:
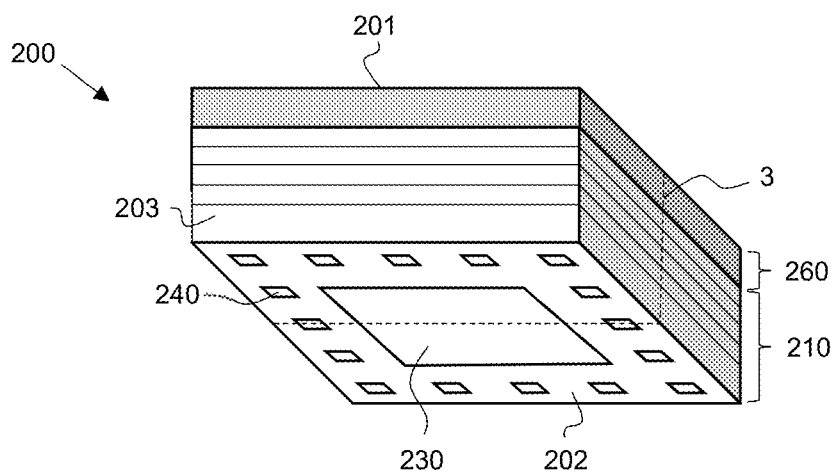

Turning now to FIGS. 2A and 2B (referred to collectively as FIG. 2), an embodiment of a power amplifier device 200 is depicted. More specifically, FIGS. 2A and 2B are perspective views showing the upper and lower surfaces 201, 202, respectively, of a power amplifier device 200, according to an example embodiment.

The power amplifier device 200 has a device body shaped as a rectangular prism. The device body, and thus the device 200, is defined by a first device surface 201 (referred to herein as the upper device surface) and an opposed second device surface 202 (referred to herein as the lower device surface). Four device sidewalls (e.g., sidewall 203) extend between the upper and lower device surfaces 201, 202.

The device body includes an encapsulation material layer 260 connected to a substrate 210. The substrate 210, which partially defines the lower device surface 202 in some embodiments, is formed from a stack of multiple dielectric layers and multiple patterned conductive layers in an alternating arrangement. As will be discussed in more detail later in conjunction with FIG. 3, one or more power transistor dies (e.g., dies 340, 341, FIG. 3) are connected to substrate die contacts (e.g., contacts 330-333, FIG. 3) exposed at a first surface of the substrate 210 (e.g., substrate surface 311, FIG. 3). The first substrate surface is recessed below the lower device surface 202, and a thermal structure 230 contacts the embedded die(s) and extends outward to define a portion of the lower device surface 202.

According to an embodiment, a plurality of conductive interconnects 240 (e.g., interconnects 240-1, 240-2, FIG. 3) have distal ends exposed at the lower device surface 202. The conductive interconnects 240 extend into the die body, and their proximal ends are connected to additional substrate contacts and/or to the patterned conductive layers of the substrate 210. Essentially, the conductive interconnects 240 function as terminals configured to receive and convey RF signals, bias voltages, and ground connections to the amplifier circuitry (e.g., dies and surface mount components) embedded within the die body.

Figure 3:
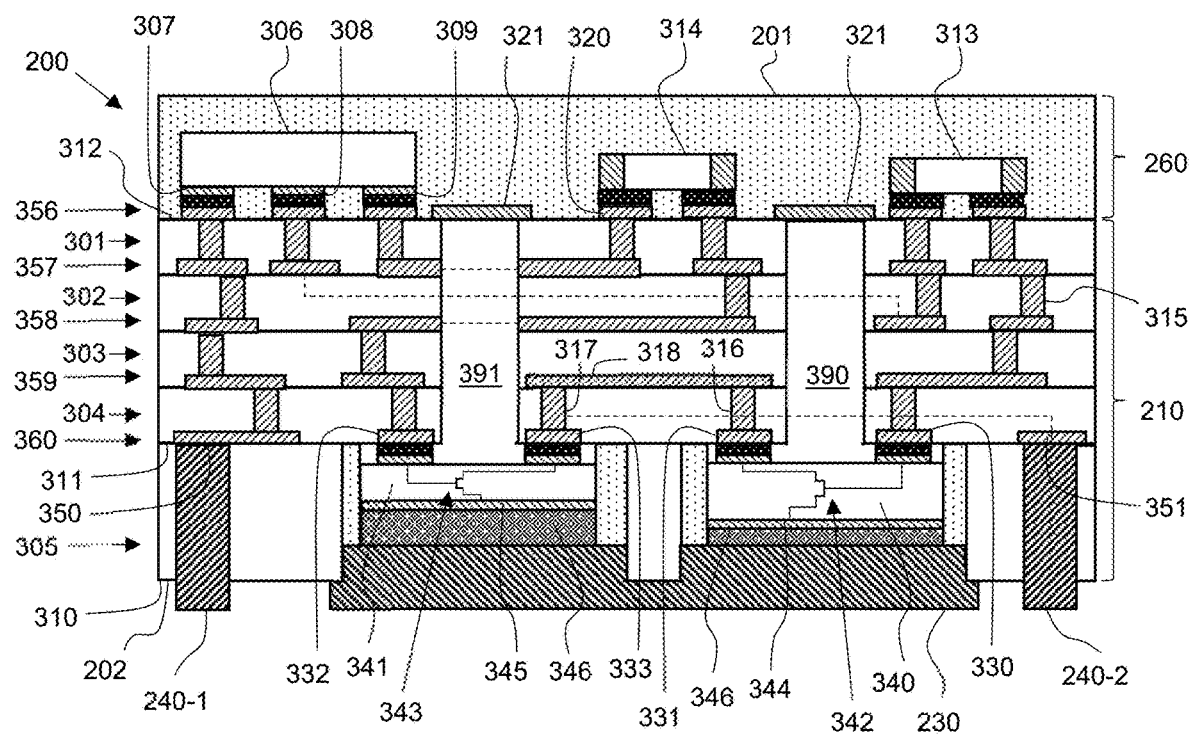
FIG. 3 is a side, cross-sectional view of the power amplifier device of FIGS. 2A and 2B along bisection line 3, according to an example embodiment.
Figure 3:
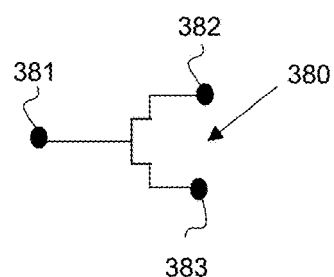

In addition, one or more surface mount components (e.g., components 306, 313, 314, FIG. 3) are connected to additional substrate contacts (e.g., contact 320, FIG. 3) that are exposed at a second surface of the substrate 210 (e.g., substrate surface 312, FIG. 3). The encapsulation material layer 260 covers the surface mount component(s) and the second substrate surface, and substantially defines the upper device surface 201.

FIG. 3 is a side, cross-sectional view of the power amplifier device 200 of FIGS. 2A and 2B along bisection line 3, according to an example embodiment. As discussed in conjunction with FIGS. 2A and 2B, the device body includes an encapsulation material layer 260 connected to a substrate 210. The substrate 210 is formed from a stack of multiple dielectric layers 301, 302, 303, 304, 305 and multiple patterned conductive layers 356, 357, 358, 359, 360 in an alternating arrangement. A lower surface 310 of the substrate partially defines the lower device surface 202. A plurality of conductive vias (e.g., via 315) electrically connect the patterned conductive layers 356-360. First and second sets of substrate die contacts 330, 331, 332, 333 are exposed at a first surface 311 of the substrate 210, and additional substrate contacts 320 are exposed at a second surface 312 of the substrate 210. The first set of substrate die contacts includes contacts 330, 331 that function as I/O contacts for the first power transistor die 340, and additional contacts that may provide for bias, ground, and control signal connections. The first set of substrate die contacts (including contacts 330, 331) are spaced apart from each other, and a "first region" is defined as a portion of the first substrate surface 311 that is located between the first set of substrate die contacts 330, 331 (e.g., region 890, FIG. 8). Similarly, the second set of substrate die contacts includes contacts 332, 333 that function as I/O contacts for the second power transistor die 341, and additional contacts that may provide for bias, ground, and control signal connections. The second set of substrate die contacts (including contacts 332, 333) also are spaced apart from each other, and a "second region" is defined as a portion of the first substrate surface 311 that is located between the second set of substrate die contacts 332, 333 (e.g., region 891, FIG. 8).

In the illustrated embodiment, one or more openings in one or more outer layers 305 of the substrate 210 expose one or more portions of the first substrate surface 311 at which the first and second sets of substrate die contacts 330-333 are exposed. According to an embodiment, two power transistor dies 340, 341 are connected to the substrate die contacts 330-333, and thus are connected to the first substrate surface 311. More particularly, power transistor die 340 is coupled to the first set of substrate die contacts (including contacts 330, 331), and power transistor die 341 is coupled to the second set of substrate die contacts (including contacts 332, 333). The first substrate surface 311 is recessed below the lower device surface 202, and a thermal structure 230 that extends into the die openings thermally couples to the embedded dies 340, 341 and extends outwardly to define a portion of the lower device surface 202.

According to an embodiment, a first embedded die 340 is a power transistor die that includes at least one integrated transistor 342 (e.g., Si, GaN, SiGe, HEMT, LDMOS, etc.) that functions as the carrier amplifier (e.g., carrier amplifier 130, 140, FIG. 1). In addition, a second embedded die 341 also includes at least one integrated power transistor 343 (e.g., Si, GaN, SiGe, HEMT, LDMOS, etc.) that functions as the peaking amplifier (e.g., peaking amplifier 131, 141, FIG. 1). Each die 340, 341 has an active area, which is defined herein as a portion of the die 340, 341 that includes the integrated power transistor 342, 343.

An enlarged depiction of a power transistor 380 that would be suitable for integration within the dies 340, 341 is shown in FIG. 3 below the power amplifier device 200. The power transistor 380 includes a gate terminal 381, a drain terminal 382, and a source terminal 383. As can be seen in the cross-section of device 200, the gate and drain terminals of each transistor 342, 343 are coupled to gate and drain contacts (not numbered) that are exposed at first die surfaces of the dies 340, 341. The gate and drain contacts, in turn, are coupled to (e.g., soldered to) the substrate die contacts 330-333. The source terminal of each transistor 342, 343 is coupled to a conductive bottom layer 344, 345 of each die 340, 341, and the conductive bottom layer 344, 345 defines a second die surface of each die 340, 341.

According to an embodiment, the gate and/or drain contacts of the dies 340, 341 may be elongated (e.g., they may have a length dimension that is significantly greater than a width dimension). For example, the drain contact of a die 340, 341 may have a length dimension that is at least five times greater than a width dimension of the drain contact. According to a further embodiment, each of the substrate die contacts 330-333 are shaped and sized to correspond to the shape and size of the gate or drain contact to which the substrate die contact 330-333 is connected. In other words, the substrate die contacts 330-333 also may be elongated, and further may have shapes and sizes that ensure good connection along the entire lengths of the gate and/or drain contacts of the dies 340, 341.

Figure 8:
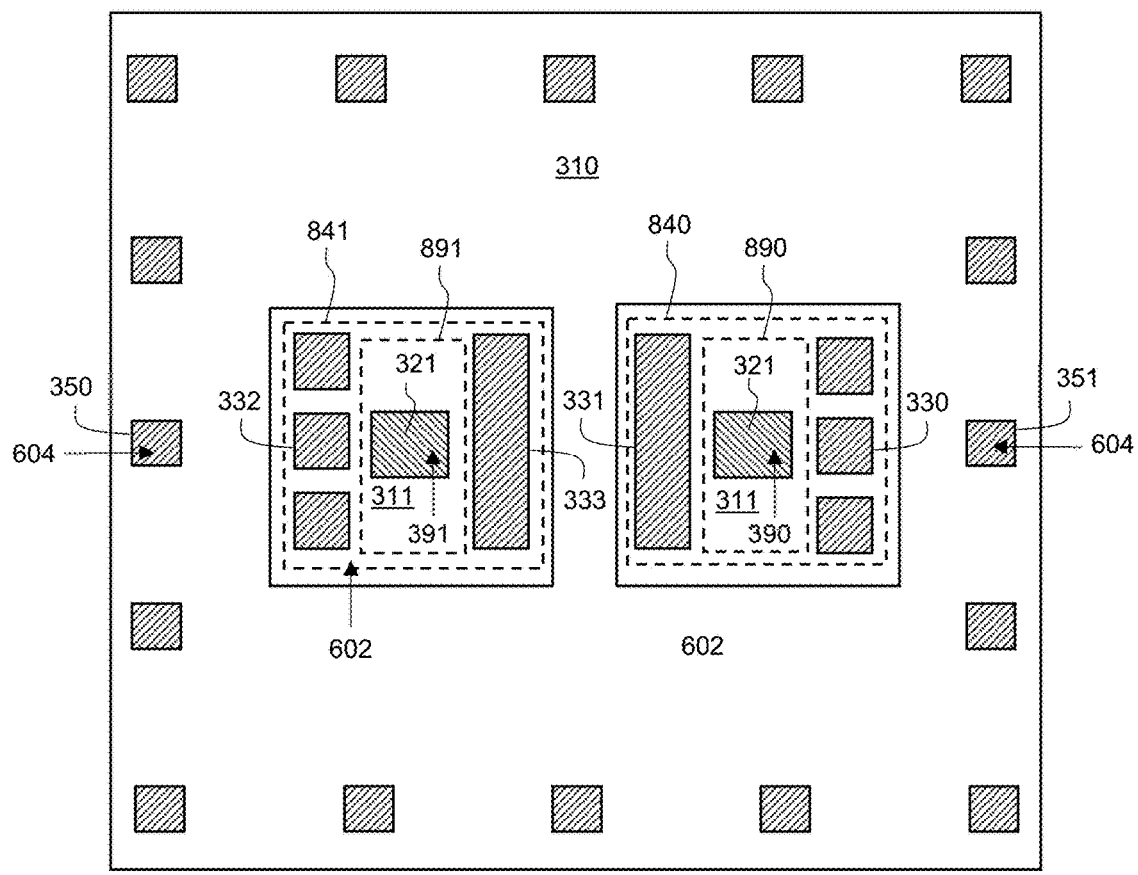

According to an embodiment, a first air cavity 390 extends into the substrate 210 through the first region of the substrate surface 311 (e.g., region 890, FIG. 8). Similarly, a second air cavity 391 extends into the substrate 210 through the second region of the substrate surface 311 (e.g., region 891, FIG. 8). The air cavities 390, 391 may produce the beneficial result of reducing parasitic impacts (e.g., performance degradation of active and passive circuits), which otherwise may result from the proximity of the dies 340, 341 to the substrate material.

Each of the first and second air cavities 390, 391 has a proximal end at the first substrate surface 311, a distal end that is recessed within the substrate 210, and sidewalls extending between the proximal and distal ends. The proximal end of each air cavity 390, 391 is defined by an opening in the first substrate surface 311. As can be better grasped with reference to FIG. 8, each opening has an area that is smaller than the die footprint (e.g., die footprint 840, 841, FIG. 1), and that is equal to or smaller than the area of the first or second region (e.g., regions 890, 891, FIG. 8). According to an embodiment, each opening has an area that is at least one tenth of the size of the die footprint (e.g., from one tenth to one half of the die footprint size). In other embodiments, each opening may have an area that is at least one half of the size of the die footprint.

According to an embodiment, when the power transistor dies 340, 341 are coupled to the first and second sets of substrate die contacts (e.g., including contacts 330-333), each of the active areas of the dies 340, 341 is aligned with one of the first or second air cavities 390, 391 (i.e., the first and second air cavities 390, 391 are positioned directly over the active areas of the power transistor devices 340, 341).

In some embodiments, and as shown in FIG. 3, each of the first and second air cavities 390, 391 may extend from the first substrate surface 311 through all of the multiple dielectric layers 301-304 to substrate surface 312. As will be explained in more detail later in conjunction with FIG. 15, in other embodiments, the first and second air cavities may extend from the first substrate surface 311 through at least one but fewer than all of the multiple dielectric layers 301-304.

According to an embodiment, conductive (metal) caps 321 are located at and extend across the distal ends of the first and second air cavities 390, 391. In some embodiments, the conductive caps 321 may be formed from portions of patterned conductive layer 356 (or another conductive layer). In other embodiments, the conductive caps 321 may be metal coins that are attached to the upper surface 312 of substrate 210 over each air cavity 390, 391. The conductive caps 321 may be electrically floating, or may be coupled to a ground reference, in various embodiments. Either way, the conductive caps 321 may provide the advantage of mitigating electromagnetic interference from the power transistor dies 340, 341 that may otherwise detrimentally affect the performance of the various active and passive circuits that also are included in device 200 (e.g., circuits that include surface mount devices 306, 313, 314, among others).

According to an embodiment, a thermal structure 230 extends into the opening (or openings) of the outermost substrate layer(s) 305, and is coupled (e.g., using die attach 346, solder, or other suitable conductive materials) to the conductive bottom layers 344, 345 of the power transistor dies 340, 341. As shown in FIG. 3, when the power transistor dies 340, 341 have different heights (vertical dimension in FIG. 3), the thickness of the die attach 346 may be different between each die 340, 341 and the thermal structure 230. Alternatively, the thermal structure 230 could be machined so that portions of the structure 230 that are coupled to the dies 340, 341 (e.g., "pedestals") have different heights to accommodate the different die heights. In such an embodiment, if the pedestal heights are configured so that each pedestal is the same distance from the corresponding die, the thickness of the die attach 346 can be the same for both dies 340, 341.

The outer surface of the thermal structure 230 corresponds to a portion of the lower surface 202 of the device 200. As will be explained in more detail later, the thermal structure 230 is configured to convey heat generated by the dies 340, 341 away from the dies 340, 341, and to an external system heat sink (e.g., heat extraction component 1330 or 1430, FIGS. 13, 14) associated with an amplifier system (e.g., a transmitter of a communication system).

As mentioned previously, a plurality of conductive interconnects 240-1, 240-2 (e.g., interconnects 240, FIG. 2) have distal ends exposed at the lower device surface 202. The conductive interconnects 240-1, 240-2 extend through the outermost substrate layer(s) 305, and their proximal ends are electrically connected to the patterned conductive layers 356-360 of the substrate 210. These connections may be made through interconnect contacts 350, 351. For example, the interconnect contacts 350, 351 may be positioned at the first substrate surface 311. As mentioned previously, the conductive interconnects 240 (FIG. 2) are configured to convey RF signals, bias voltages, control signals, and ground connections to the amplifier circuitry (e.g., dies 340, 341 and surface mount components 306, 313, 314) embedded within the device 200. In FIG. 3, conductive interconnect 240-1 more specifically corresponds to an RF input terminal (e.g., terminal 102, FIG. 1), and conductive interconnect 240-2 more specifically corresponds to an RF output terminal (e.g., terminal 104, FIG. 1).

The one or more surface mount components 306, 313, 314 are connected to additional substrate contacts 320 that are exposed at a second surface 312 of the substrate 210. The encapsulation material layer 260 covers the surface mount components 306, 313, 314 and the second substrate surface 312. The encapsulation material layer 260 essentially defines the upper device surface 201. According to an embodiment, sidewalls of the substrate 210 and the encapsulation material layer 260 that are on the same side of the device 200 are co-planar.

The surface mount components 306, 313, 314 can correspond to a number of components of an amplifier circuit (e.g., pre-amplifier transistors, power splitting circuitry, harmonic termination circuitry, inductors, capacitors, and impedance matching circuitry). For example, at least one surface mount component 306 may correspond to a power divider circuit (e.g., power divider 106, FIG. 1), which has an input terminal 307 (e.g., terminal 107, FIG. 1) and multiple output terminals 308, 309 (e.g., terminals 108, 109, FIG. 1). The power divider input terminal 307 is electrically coupled through a conductive path formed from portions of the patterned conductive substrate layers 356-360 and vias (e.g., via 315) to one of the conductive interconnects 240-1, which corresponds to the input terminal (e.g., input terminal 102, FIG. 1) of the amplifier.

The power divider circuit 306 also may have at least two output terminals 308, 309, where each output terminal is coupled to one of the inputs (e.g., drain terminals) of the transistors 342, 343 within the power transistor dies 340, 341. The output terminals 308, 309 of the power divider circuit 306 may be coupled to the inputs of the power transistor dies 340, 341 directly through conductive paths formed by the patterned conductive layers 356-360 and vias (e.g., via 315). Alternatively, as shown in FIG. 3, the output terminals 308, 309 of the power divider circuit 306 may be coupled through conductive paths in the substrate 210 to additional surface mount components 313, 314, which correspond to portions of input impedance matching circuits (e.g., circuits 113, 114, FIG. 1). Those additional surface mount components 313, 314, in turn, may be coupled to the inputs of the power transistor dies 340, 341 directly through conductive paths formed by the patterned conductive layers 356-360 and vias (e.g., via 315). Note that, in FIG. 3 and other figures described later, some conductive paths are indicated with dashed lines.

Accordingly, when an input RF signal is provided to interconnect 240-1, the input RF signal may be conveyed through the substrate 210 to the input terminal 307 of the power divider circuit 306, and the power divider circuit 306 may perform the function of splitting the input RF signal into multiple (e.g., two or more) separate signals (e.g., a carrier signal and a peaking signal). The separate signals provided at the power divider outputs 308, 309 may then be conveyed through the substrate 210 to the impedance matching components 313, 314 or directly to the inputs of the power transistor dies 340, 341. Although the power divider circuit 306 is shown as a single surface-mount component, in other embodiments, multiple surface mount components may be used to implement the power divider circuit 306.

Although not shown in FIG. 3, at least one additional surface-mount component may be used to implement a harmonic termination circuit (e.g., harmonic termination circuits 116, 118, FIG. 1) coupled between each amplification path and ground. For example, when a harmonic termination circuit includes a shunt LC circuit, at least part of the inductance (L) can be implemented using a series of conductive traces and vias of the patterned conductive layers 356-360, another part of the inductance (L) can be implemented with a surface mount component coupled to contacts at substrate surface 312, and the capacitance (C) can be a surface mount component coupled to additional contacts at substrate surface 312. The inductance (L) and capacitance (C) can be coupled in series through the patterned conductive layers 356-360. An input to each LC circuit can be coupled to a point along each of the amplification paths (e.g., a point before or after each power transistor), and an output to each LC circuit can be coupled through the patterned conductive layers 356-360 to another one of the conductive interconnects 240. When the device 200 is incorporated into a larger system, that conductive interconnect 240 can be coupled to ground.

As discussed in conjunction with FIG. 1, for a non-inverted Doherty amplifier, a phase delay element (e.g., phase delay element 182, FIG. 1) is coupled between the power divider 106 and the input to the peaking amplifier 131, 141. According to an embodiment, the phase delay element (e.g., phase delay element 182, FIG. 1) may be implemented using a conductive path through the substrate 210, which electrically couples an output of the power divider circuit 306 to an input (e.g., gate terminal) of the peaking amplifier die (e.g., the terminal of die 341 coupled to substrate contact 332). The conductive path corresponding to the phase delay element may have an electrical length of about 90 degrees, according to an embodiment.

As also discussed in conjunction with FIG. 1, the outputs of the carrier and peaking power amplifiers 140, 141 each are coupled to a combining node 180. According to an embodiment, the combining node is designed to be co-located with the output terminal (e.g., drain terminal) of the peaking amplifier die (e.g., the terminal of die 341 coupled to substrate contact 333). The impedance inverter/phase delay element (e.g., impedance inversion/phase delay element 184, FIG. 1) may be implemented using a conductive path through the substrate 210, which electrically connects the output terminal (e.g., drain terminal) of the carrier amplifier die 340 (e.g., the terminal of die 340 coupled to substrate contact 331) to the combining node at the output terminal (e.g., drain terminal) of the peaking amplifier die 341. For example, in FIG. 3, the output terminal of the carrier amplifier die 340 is electrically connected to the output terminal of the peaking amplifier die 341 through vias 316, 317 and conductive trace 318 (i.e., a portion of patterned conductive layer 359).

As also discussed in conjunction with FIG. 1, the combining node 180 is electrically coupled to the output terminal 104 of the amplifier. According to an embodiment, interconnect 240-2 functions as the output terminal of the amplifier device, and the output terminal (e.g., drain terminal) of the peaking amplifier die 341 is electrically coupled to interconnect 240-2 through a conductive path (indicated with a dashed line) through the substrate 210.

Although not shown in FIG. 3, some conductive interconnects 240 may be used to receive bias voltages, which may be conducted from the interconnects 240 to the power transistor dies 340, 341 through the patterned conductive layers 356-360 and conductive vias of the substrate 210. In addition, other conductive interconnects 240 may be used to provide a ground reference (e.g., they may be coupled to ground when device 200 is incorporated into a larger system). The ground connection between the ground interconnects 240 and other circuit components (e.g., some of surface mount devices 306, 313, 314) may be made through the patterned conductive layers 356-360 and conductive vias of the substrate 210. Still other conductive interconnects 240 may be used to convey control signals to components within device 200.

Accordingly, the power amplifier device 200 illustrated in FIGS. 2 and 3 may encompass a full Doherty amplifier circuit in a compact package. It may be noted that no wirebond arrays are used to interconnect the components of the Doherty amplifier. Therefore, in comparison with conventional Doherty amplifier circuits, the lack of wirebond arrays may result in increased amplifier power and efficiency. Further, minimized inductances inherent in the Doherty device embodiments described herein may enable compliance with higher band specifications.

Figure 4:
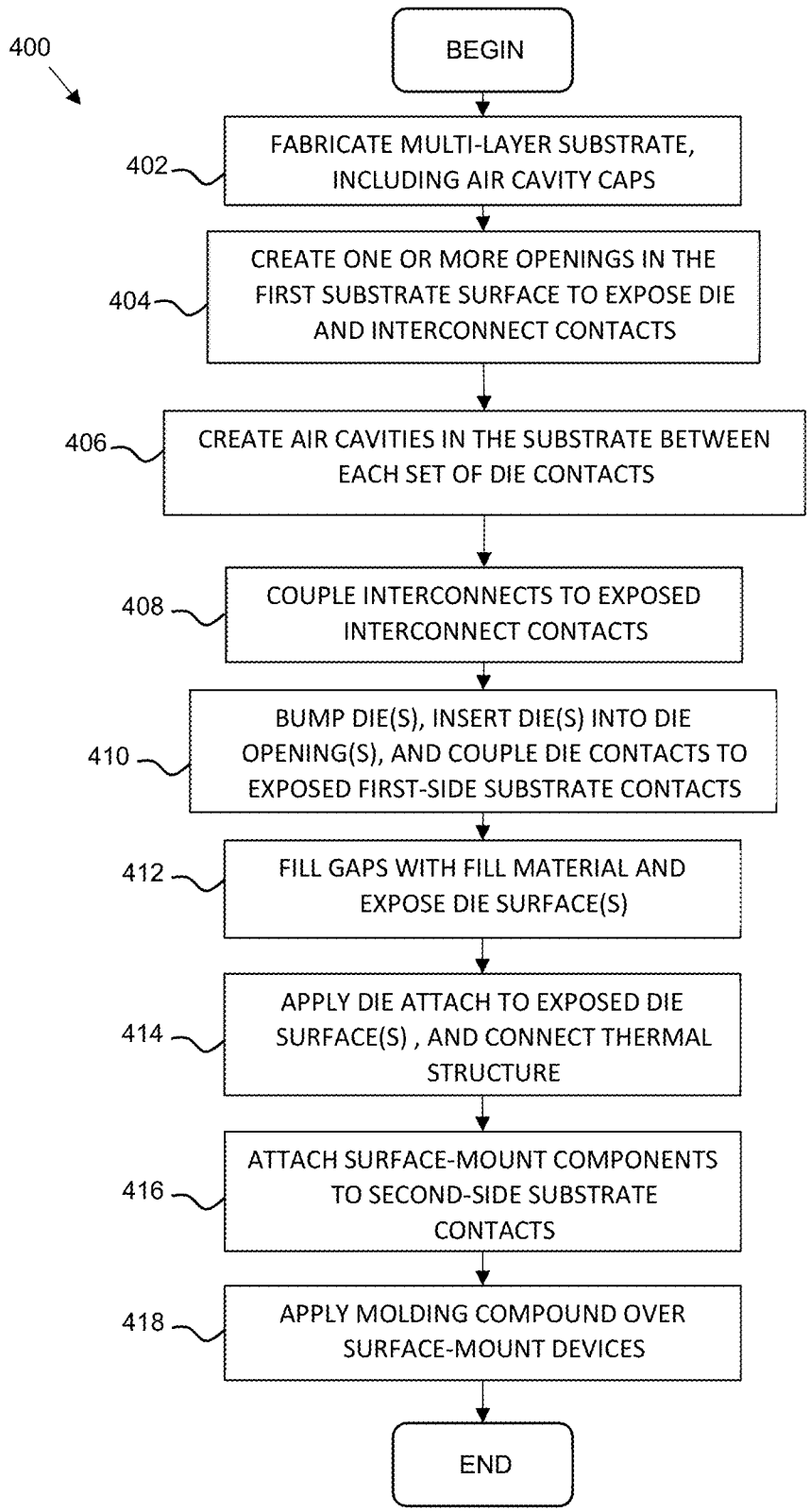
FIG. 4 is a flowchart of a method of manufacturing the power amplifier device of FIGS. 2 and 3, according to an example embodiment.

FIG. 4 is a flowchart of a method 400 of manufacturing the power amplifier device 200 of FIGS. 2 and 3, according to an example embodiment. For enhanced understanding, FIG. 4 should be viewed simultaneously with FIGS. 5-12, which are side, cross-sectional views of the power amplifier device of FIGS. 2 and 3 at various stages of manufacture, according to an embodiment.

Figure 5:
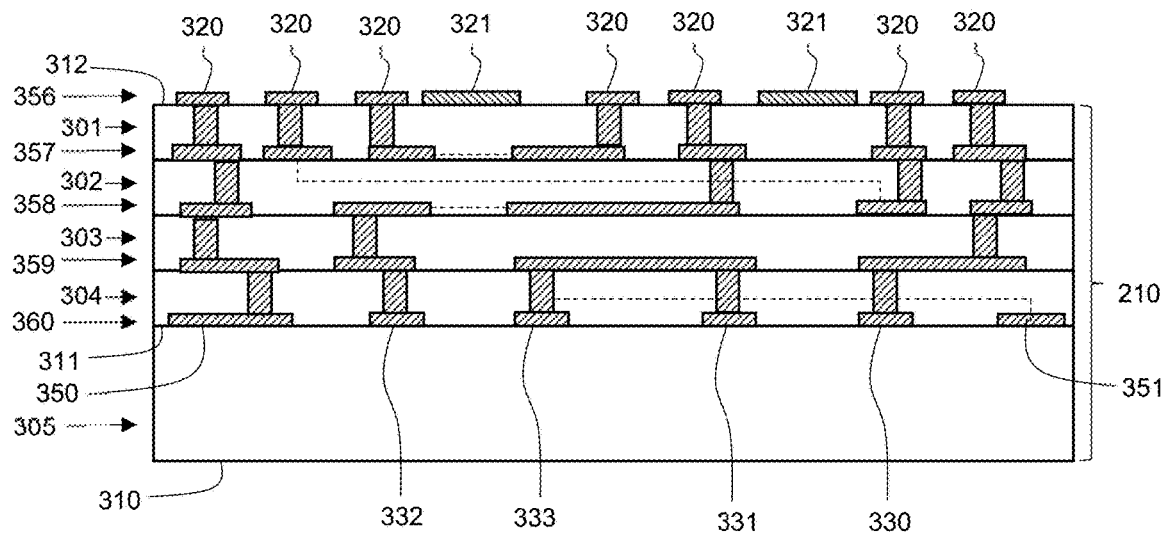
FIGS. 5-12 are various views of the power amplifier device of FIGS. 2 and 3 at various stages of manufacture, according to an embodiment.

Referring also to FIG. 5, the method begins, in step 402, by fabricating a multi-layer substrate 210. The substrate 210 is formed from a stack of multiple dielectric layers 301-305 and multiple patterned conductive layers 356-360, which are built up in an alternating arrangement. The substrate 210 is defined by a lower surface 310, an upper surface 312, and sidewalls extending between the lower and upper surfaces 310, 312. For example, the dielectric layers 301-305 may be formed from PCB dielectric materials (e.g., FR-4), ceramic, or other suitable dielectric materials. The patterned conductive layers 356-360 are formed from conductive metals, which are patterned during the build-up process. Also during the build-up process, conductive vias (e.g., vias 315-317, FIG. 3) are formed through the dielectric layers in order to connect various portions of adjacent patterned conductive layers.

According to an embodiment, conductive caps 321 (e.g., metal coins) may be attached to the upper surface 312 of the substrate 210 in locations that correspond to the distal ends of the (to be formed) air cavities (e.g., air cavities 390, 391, FIG. 3). In another embodiment, the conductive caps 321 may be formed from portions of the patterned conductive layer (e.g., layer 356) where the distal ends of the air cavities will be located. In still another embodiment, the conductive caps 321 may be attached to the upper surface 312 of the substrate 210 after forming the air cavities 390, 391 (e.g., after step 406, discussed below).

Various conductive paths within the substrate 210 (formed from various combinations of conductive layer portions and conductive vias) will provide for interconnections between dies and components, which will later be mounted to the substrate 210. In addition, some of the conductive paths within the substrate may be configured to provide desired inductances and impedance transformations. For example, a conductive path comprising vias 316, 317 and conductive layer portion 318 may form a phase delay and impedance inverter element (e.g., impedance inverter/phase delay element 184, FIG. 1).

It should be noted that, although substrate 210 is shown to include five dielectric layers 301-305 and five conductive layers 356-360, other embodiments of a substrate may include more or fewer dielectric layers and/or conductive layers.

Once completed, the substrate 210 includes substrate contacts 320, which are exposed at the upper surface 312 of the substrate 210. In addition, the substrate includes embedded substrate die contacts 330-333 and embedded interconnect contacts 350, 351 at an internal, surface 311 of the substrate 210.

Figure 6:
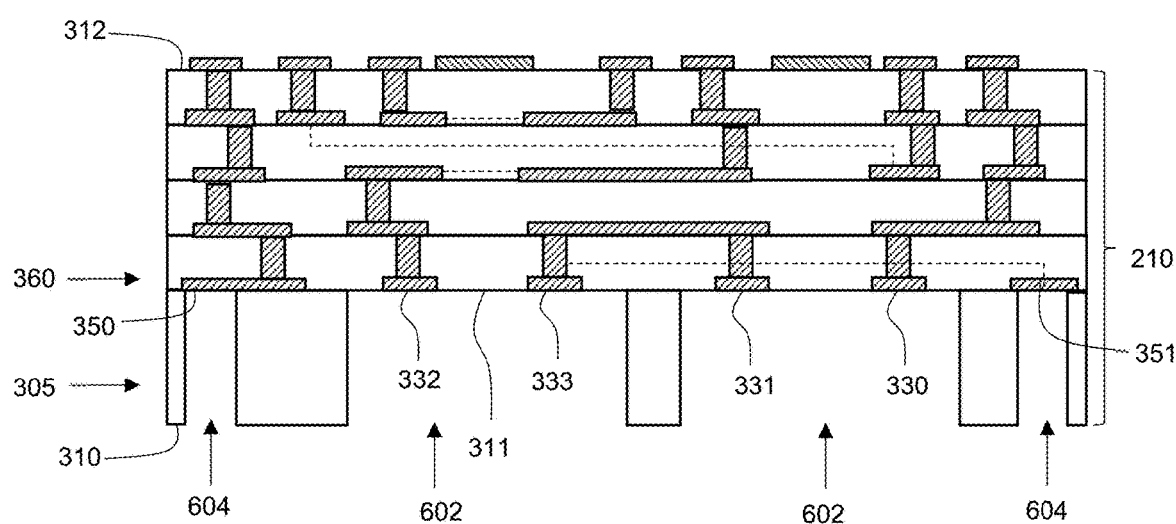

Referring now to FIG. 6, the method continues, in step 404, by creating one or more first die openings 602 through the lower substrate surface 310 to expose substrate die contacts 330-333 at the interior surface 311 of the substrate 210. Additionally, in step 404, second interconnect openings 604 are formed through the lower substrate surface 310 to expose interconnect contacts 350, 351, which also may be located at the interior surface 311. According to an embodiment, the openings 602, 604 may be formed using an etching process, which is timed to stop when the substrate and interconnect contacts 330-333, 350, 351 are reached.

Although FIG. 6 illustrates that two die openings 602 are formed in substrate 210, in alternate embodiments, a single opening may be formed, which will accommodate both power transistor dies 340, 341. In addition, although one embodiment for forming interconnect openings 604 may form a separate opening for each interconnect 240, other embodiments may include forming a larger opening that spans multiple interconnect contacts, and into which multiple interconnects 240 may be inserted.

Figure 7:
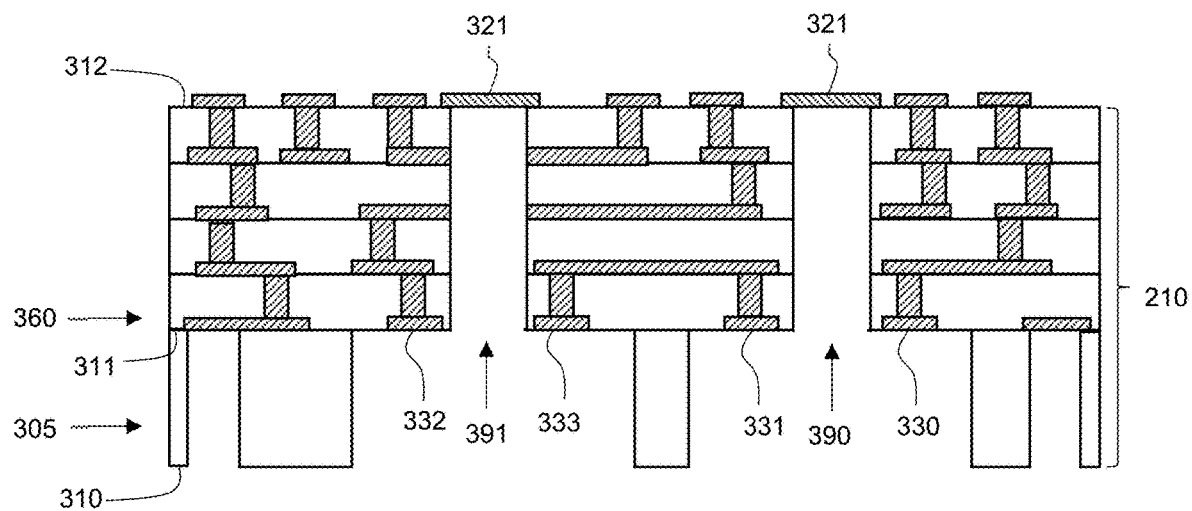

Referring now to FIGS. 7 and 8, which are cross-sectional and bottom views of device 200, respectively, at a same fabrication stage, the method continues, in step 406, by creating air cavities 390, 391 in the substrate between each set of substrate contacts (e.g., within each of regions 890, 891, FIG. 8). In FIG. 8, for enhanced understanding, the previously-discussed first and second regions 890, 891 between sets of die contacts, and the approximate footprints 840, 841 of the to-be-connected dies 340, 341 are indicated with dashed-line boxes.

According to an embodiment, the air cavities 390, 391 may be formed in regions 890, 891 using an etching process, which is timed to stop when the conductive caps 321 are reached. In an alternate embodiment, as indicated previously, the air cavity openings 390, 391 may be formed to extend all the way through the substrate 210, and the conductive caps 321 can be attached over the openings 390, 391 thereafter.

Again, each of the first and second air cavities 390, 391 has a proximal end at the first substrate surface 311, a distal end that is recessed within the substrate 210 (and co-located with caps 321), and sidewalls extending between the proximal and distal ends. The proximal end of each air cavity 390, 391 is defined by an opening in the first substrate surface 311. With reference to FIG. 8, once the air cavities 390, 391 have been formed, the conductive caps 321 can be seen at the bottom of each air cavity 390, 391. It also can be observed that each opening (or the cross-section of each cavity 390, 391) has an area that is smaller than the die footprint (e.g., die footprint 840, 841), and that is equal to or smaller than the area of the first or second region 890, 891. According to an embodiment, each opening has an area that is at least one tenth of the size of the die footprint 840, 841 (e.g., from one tenth to one half of the die footprint size). In other embodiments, each opening may have an area that is at least one half of the size of the die footprint.

Figure 9:
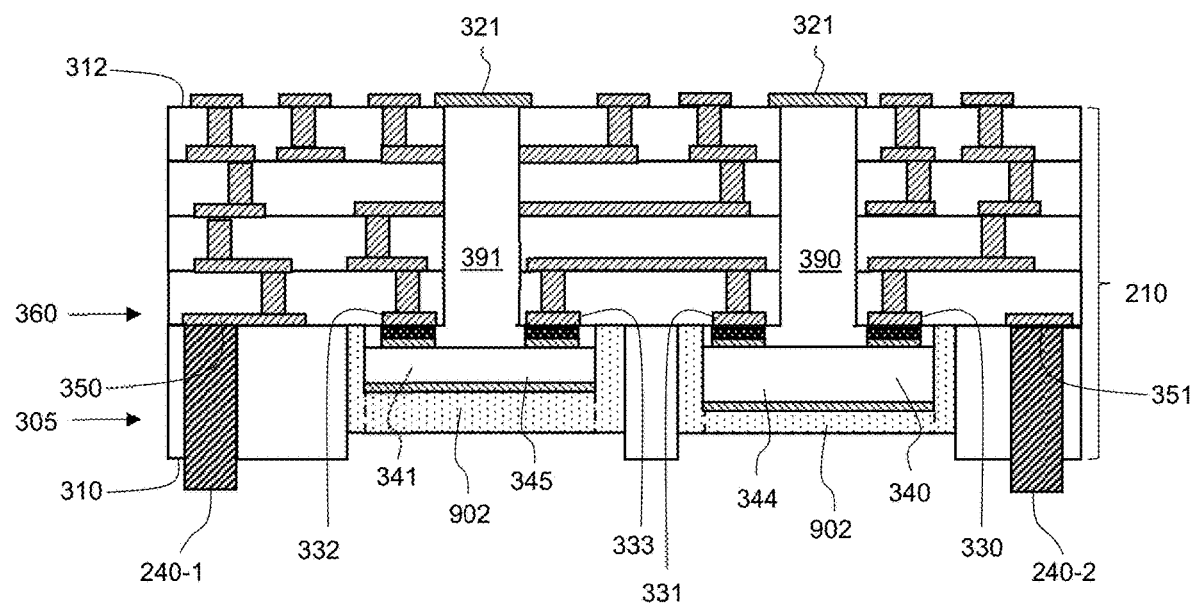

Referring now to FIG. 9, in step 408, conductive interconnects 240 are physically and electrically coupled to the interconnect contacts 350, 351 exposed through the interconnect openings 604. In one embodiment, the conductive interconnects 240 are conductive posts that are inserted into the interconnect openings 604, and then soldered, brazed, or otherwise attached to the interconnect contacts 350, 351. In other embodiments, the conductive interconnects 240 may be formed by filling the interconnect openings 604 with conductive material. In still other embodiments, the interconnects 240 may be portions of a leadframe (not shown). In still other embodiments, multiple interconnects 240 may be packaged side-by-side in one or more separate dielectric interposer structures (not shown), and the dielectric interposer structures may be inserted into larger interconnect openings that span multiple interconnect contacts 350, 351. As shown in FIG. 2B, the interconnect openings and the interconnect contacts 240 may be located adjacent to multiple sides of the device 200 (e.g., to all four sides, as shown, or to less than all four sides).

In step 410, the power transistor dies 340, 341 are "bumped," by applying solder paste to the die bondpads (e.g., to the input and output, or gate and drain, bondpads). The dies are then inserted into the die openings 602. The die bondpads and the solder paste on the die bondpads are brought into contact with corresponding substrate die contacts 330-333. A solder reflow process may then be performed to solder-attach the die bondpads to the substrate die contacts 330-333. As discussed previously, once the dies 340, 341 are attached to the die contacts 330-333, the active areas of the dies 340, 341 should be aligned with the air cavities 390, 391, respectively.

In step 412, gaps between the power transistor dies 340, 341 and sidewalls of the die openings 602 are then filled in with fill material 902 (e.g., plastic encapsulant material). According to an embodiment, the fill material 902 is applied so that it fills the gaps between the sidewalls of the dies 340, 341 and the sidewalls of openings 602, but so that it does not flow into air cavities 390, 391. In some embodiments, the fill material 902 may be deposited so that it only extends part-way up the sides of the dies 340, 341, leaving the outer surface of the die (e.g., conductive layer 344, 345) exposed. In other embodiments, as indicated in FIG. 7, a sufficient quantity of the fill material 902 may be deposited in the openings 602 so that the fill material 902 completely covers the power transistor dies 340, 341. In such an embodiment, portions of the fill material 902 subsequently may be removed, as indicated by dashed lines in the fill material 902, to expose the conductive layers 344, 345 on the outward facing surface of the power transistor dies 340, 341. As discussed previously, the conductive layers 344, 345 that define the exposed outer surfaces of the dies 340, 341 may be electrically connected, within each die 340, 341, to a source terminal of a transistor embedded within the die 340, 341.

Figure 10:
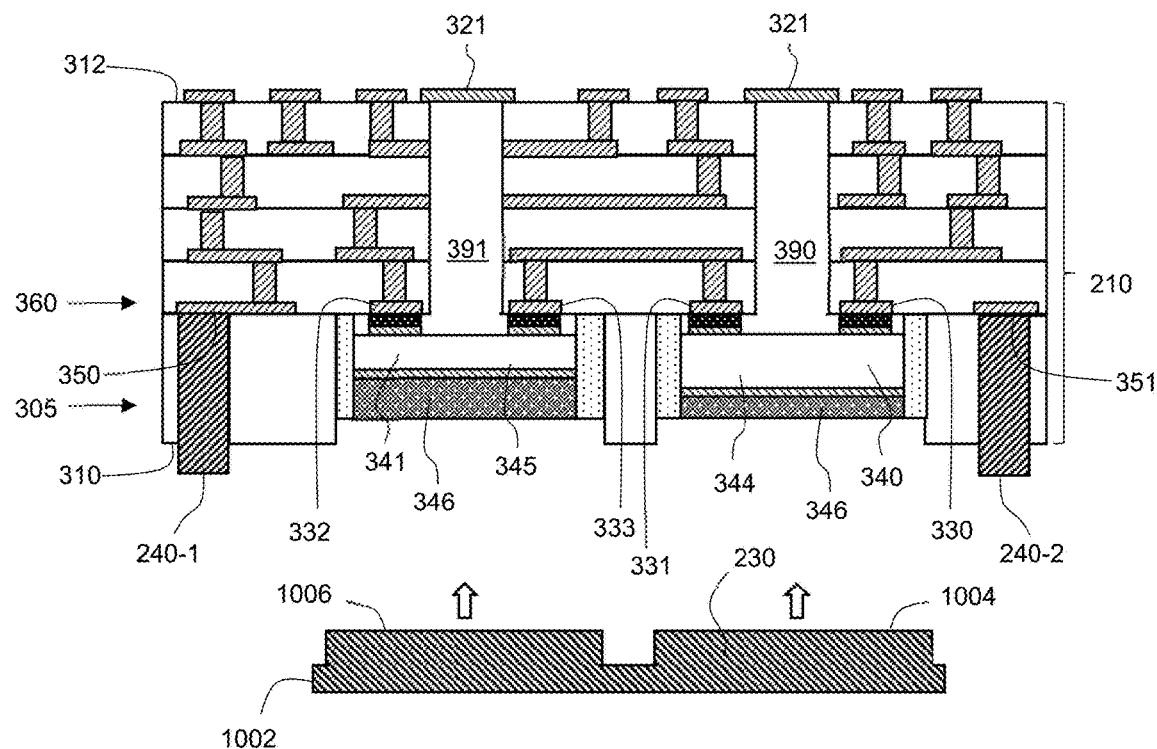
Figure 11:
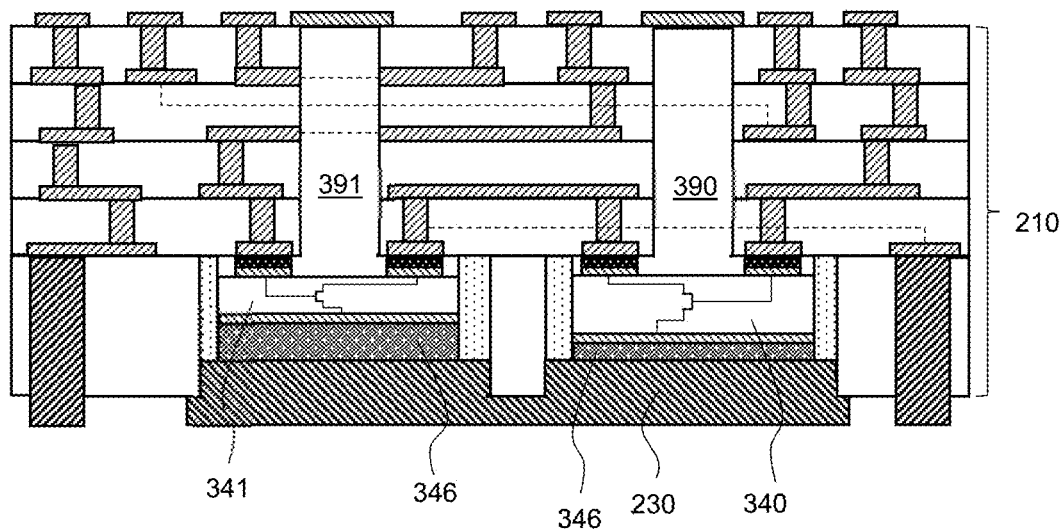

Referring now to FIGS. 10 and 11 and step 414, electrically and thermally conductive die attach material 346 (e.g., solder paste, sinter paste, or other suitable materials) is applied to the outward facing surfaces of the dies 340, 341, and more particularly to the conductive layers 344, 345 of the dies 340, 341. As indicated previously, the thickness of the die attach material 346 over each die 340, 341 may be different to account for differing heights of the dies 340, 341. Alternatively, the thickness of the die attach material 346 over each die 340, 341 may be the same, and height differences may be accommodated by customizing the subsequently attached thermal structure 230.

The thermal structure 230 may be a simple conductive coin, or as illustrated in FIGS. 10 and 11, may have a more complicated configuration. For example, the thermal structure 230 may be a cast or machined piece of thermally conductive material (e.g., metal), which has a base 1002 and multiple pedestals 1004, 1006 that establish equal or differing thicknesses across the thermal structure 230. In the illustrated embodiment, the pedestals 1004, 1006 have equal heights (vertical dimension in FIGS. 10, 11). In other embodiments, the multiple pedestals 1004, 1006 may have different heights. This may be desirable, for example, so that equal thickness of die attach material 346 may be deposited on each die 340, 341, and the die height variation may be accommodated by the different-height pedestals.

The thermal structure 230 is then inserted into the die openings 602 and brought into contact with the die attach material 346. The device 200 is then processed (e.g., by performing a reflow or sintering process) to securely connect the thermal structure 230 to the dies 340, 341.

Figure 12:
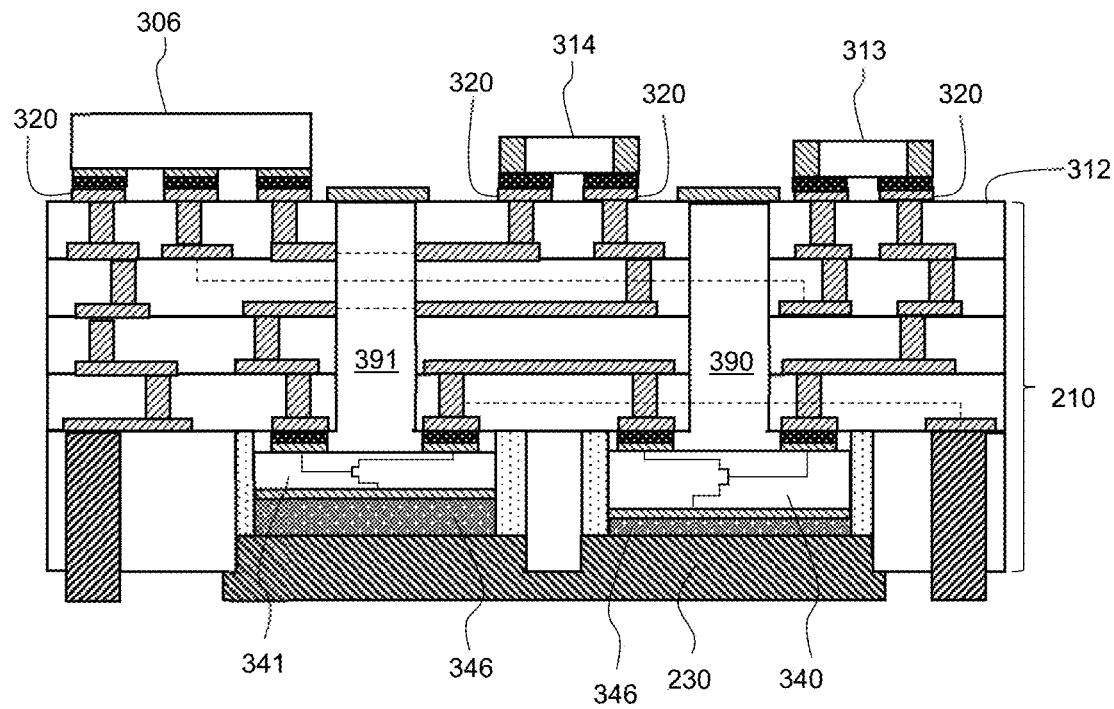

Referring now to FIG. 12 and step 416, the terminals of one or more surface mount components 306, 313, 314 are coupled (e.g., solder-attached) to the additional substrate contacts 320 that are exposed at substrate surface 312. As discussed previously, the surface mount components 306, 313, 314 can correspond to a number of components of an amplifier circuit. For example, surface mount component 306 may correspond to a power divider circuit (e.g., power divider 106, FIG. 1), and surface mount components 313, 314 may correspond to capacitors, inductors, or other circuit elements associated with impedance matching, harmonic termination, and so on. Portions of the patterned conductive layers 356-360 also may correspond to circuit elements associated with the impedance matching and harmonic termination circuits. For example, various conductive traces and vias of layers 356-360 may provide inductances of the impedance matching and harmonic termination circuits. In addition, conductive stubs (e.g., radial stubs) also may be formed from patterned portions of layers 356-360. These conductive stubs can be configured to match a load impedance to the transmission line characteristic impedance. For example, within the conductive layers 356-360, one or more stubs may be positioned along conductive paths at various locations. Each stub may be made capacitive or inductive according to whether the conductive path to which it is coupled presents an inductive or capacitive impedance, respectively.

Referring again to FIG. 3, the device 200 is completed in step 418 by applying an encapsulation material layer 260 (e.g., molding compound) over substrate surface 312 and the surface-mount components 306, 313, 314 coupled to substrate surface 312. The encapsulation material layer 260 defines the upper surface 201 of the device 200, whereas the lower substrate surface 310 and the thermal structure 230 define the lower surface 202 of the device 200.

Figure 13:
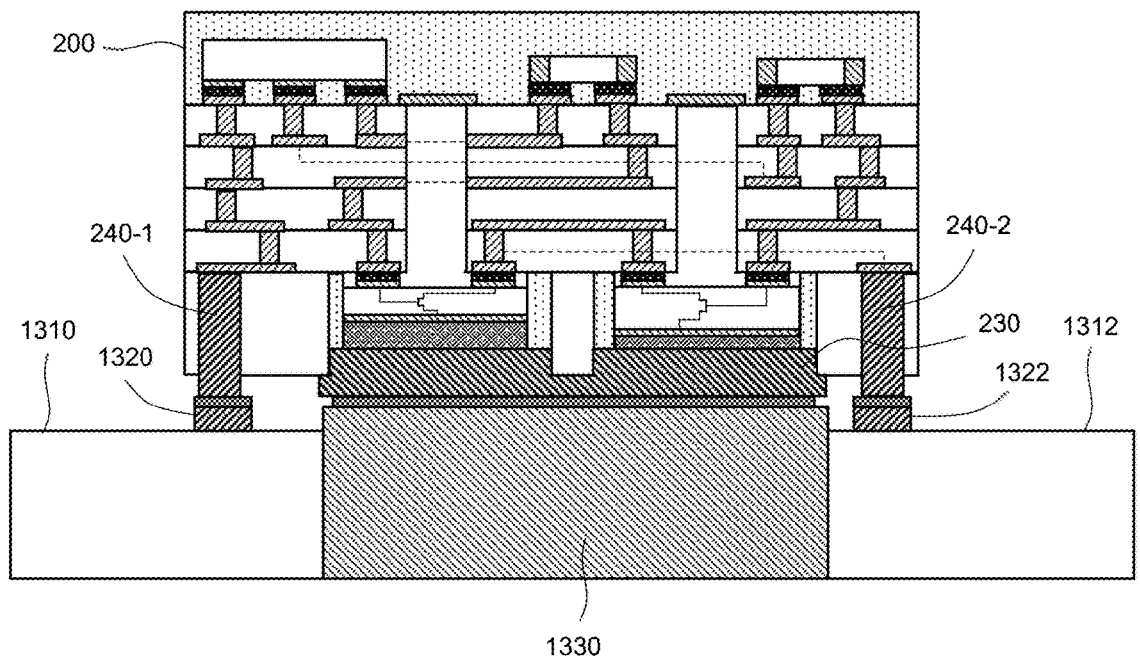
FIG. 13 is a side, cross-sectional view of the power amplifier device of FIG. 3 coupled to a system substrate with bottom-side heat extraction, according to an example embodiment.

The power amplifier device 200 may then be incorporated into a larger system (e.g., a transmitter and/or communication system). For example, FIG. 13 is side, cross-sectional view of the power amplifier device 200 of FIG. 3 coupled to a system substrate 1310, according to an example embodiment. The system substrate 1310 may be, for example, a PCB with a plurality of contact pads 1320, 1322 at a top surface 1312. Although not shown in FIG. 13, the contact pads 1320, 1322 may be electrically coupled through additional traces on the substrate 1310 to other system components. According to an embodiment, a heat sink or heat extraction component 1330 (e.g., a conductive coin, thermal vias, or other thermally conductive component) is embedded within the system substrate 1310, and has an exposed upper surface proximate the top surface 1312 of the system substrate 1310.

Device 200 is physically and electrically coupled to the system substrate 1310. More particularly, and according to an embodiment, the thermal structure 230 of device 200 is physically, electrically, and thermally coupled to the heat extraction component 1330 of the system substrate 1310. For example, thermal structure 230 and heat extraction component 1330 may be coupled together using thermal grease, solder, sinter material, or brazing. Besides providing a pathway for extraction of heat, the heat extraction component 1330 also may be coupled to system ground, and thus the heat extraction component 1330 may serve as a system ground connection for device 200.

In addition, the conductive interconnects 240-1, 240-2 (and other interconnects 240) are physically and electrically coupled (e.g., soldered) to the contact pads 1320, 1322 at the top surface 1312 of the system substrate 1310. Accordingly, the system substrate 1310 enables RF input signals to be provided to device 200 (e.g., through contact pad 1320), RF output signals to be received from device 200 (e.g., through contact pad 1322), and additional bias and ground connections to be established between the system substrate 1310 and the device 200 through other substrate contact pads and device interconnects (not shown).

The embodiment of device 200 depicted in FIGS. 3 and 13 provides for bottom-side cooling of device 200. In a bottom-side cooled system, such as that depicted in FIG. 13, the heat extraction path for the dies 340, 341 within device 200 extends through the system substrate 1310.

If device 200 were slightly modified, it could instead be incorporated into a top-side cooled system. For example, FIG. 14 is a side, cross-sectional view of another embodiment of a power amplifier device 200' coupled to a system substrate 1410 in a system with top-side heat extraction, according to an example embodiment.

Figure 14:
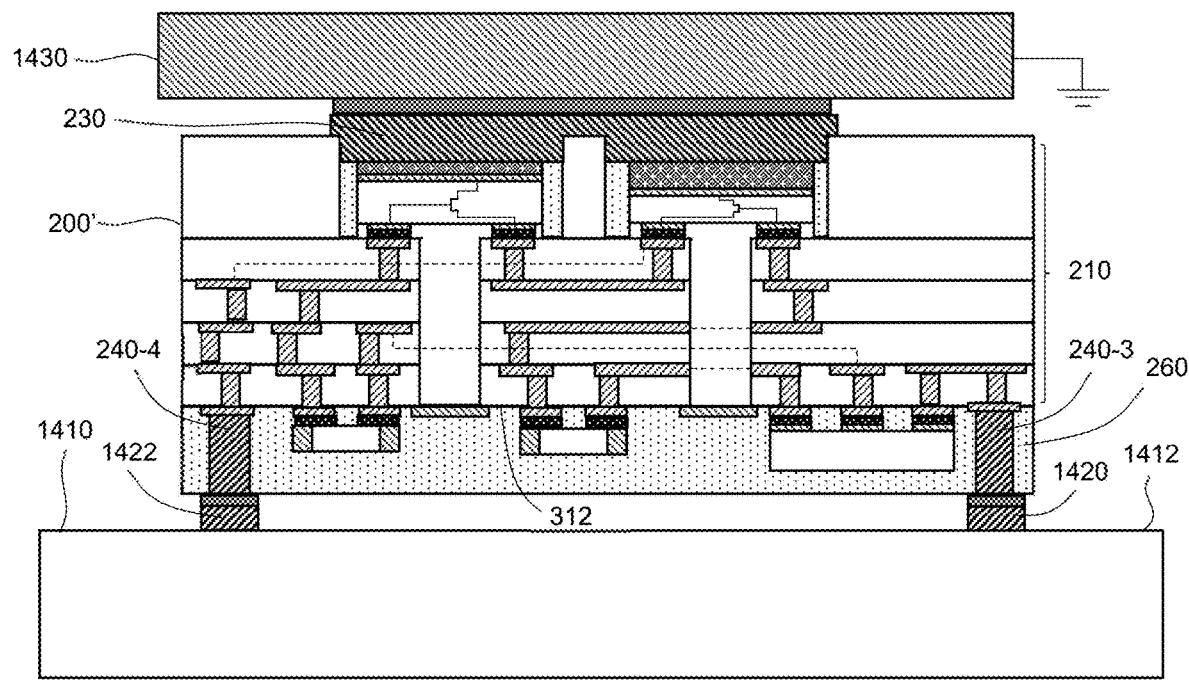
FIG. 14 is a side, cross-sectional view of another embodiment of a power amplifier device coupled to a system substrate with top-side heat extraction, according to an example embodiment.

Device 200' shown in FIG. 14 is slightly different from device 200 in FIGS. 3 and 13 to facilitate incorporation into a top-side cooled system. In particular, and referring to FIG. 3, device 200 includes conductive interconnects 240-1, 240-2 that extend through though a layer 305 located at the lower surface 310 of the device substrate 210. Thus, the conductive interconnects 240-1, 240-2 and the thermal structure 230 both are exposed at the lower surface 310 of the device 200.

In contrast, and referring to FIG. 14, in modified power amplifier device 200', conductive interconnects 240-3, 240-4, which function as I/O terminals for the device 200', instead are coupled to surface 312 of device substrate 210, and the interconnects 240-3, 240-4 extend through the encapsulation material layer 260 at the opposite surface of the device 200' from the dies 340, 341 and the thermal structure 230. Additional conductive interconnects (not shown) for bias and ground connection also would extend through the encapsulation material layer 260. In other words, in device 200', the conductive interconnects 240-3, 240-4 are exposed at an opposite surface of device 200' than the surface at which the thermal structure 230 is exposed. The conductive interconnects 240-3, 240-4 are electrically coupled through the device substrate to the various dies 340, 341 and surface mount components 306, 313, 314 as discussed above in conjunction with FIG. 3.

Again, the system substrate 1410 may be, for example, a PCB with a plurality of contact pads 1420, 1422 at a top surface 1412. Although not shown in FIG. 14, the contact pads 1420, 1422 may be electrically coupled through additional traces on the substrate 1410 to other system components.

Device 200' is physically and electrically coupled to the system substrate 1410. More particularly, and according to an embodiment, the conductive interconnects 240-3, 240-4 (and other interconnect, not shown) are physically and electrically coupled (e.g., soldered) to the contact pads 1420, 1422 at the top surface 1412 of the system substrate 1410. Accordingly, the system substrate 1410 enables RF input signals to be provided to device 200' (e.g., through contact pad 1420), RF output signals to be received from device 200' (e.g., through contact pad 1422), and additional bias and ground connections to be established between the system substrate 1410 and the device 200' through other substrate contact pads and device interconnects (not shown).

In the orientation shown in FIG. 14, the thermal structure 230 of device 200' is facing upward away from the system substrate 1410. According to an embodiment, a heat extraction component 1430 (e.g., a heat sink or conductive plate) is physically, electrically, and thermally coupled to the thermal structure 230 of device 200'. For example, thermal structure 230 and heat extraction component 1430 may be coupled together using thermal grease, solder, sinter material, or brazing. Besides providing a pathway for extraction of heat, the heat extraction component 1430 also may be coupled to system ground, and thus the heat extraction component 1430 may serve as a system ground connection for device 200'. In other embodiments, to ensure adequate RF grounding, other grounding structures may be implemented within device 200' (e.g., by providing a conductive pathway through the substrate 210 between conductive layers 344, 345 and a device terminal 240 coupled to system ground), or on the exterior surface of device 200' (e.g., by providing a conductive pathway extending along the sides of substrate 210 and layer 260 that electrically couples layers 344, 345 to a ground contact on the system substrate 1410).

Figure 15:
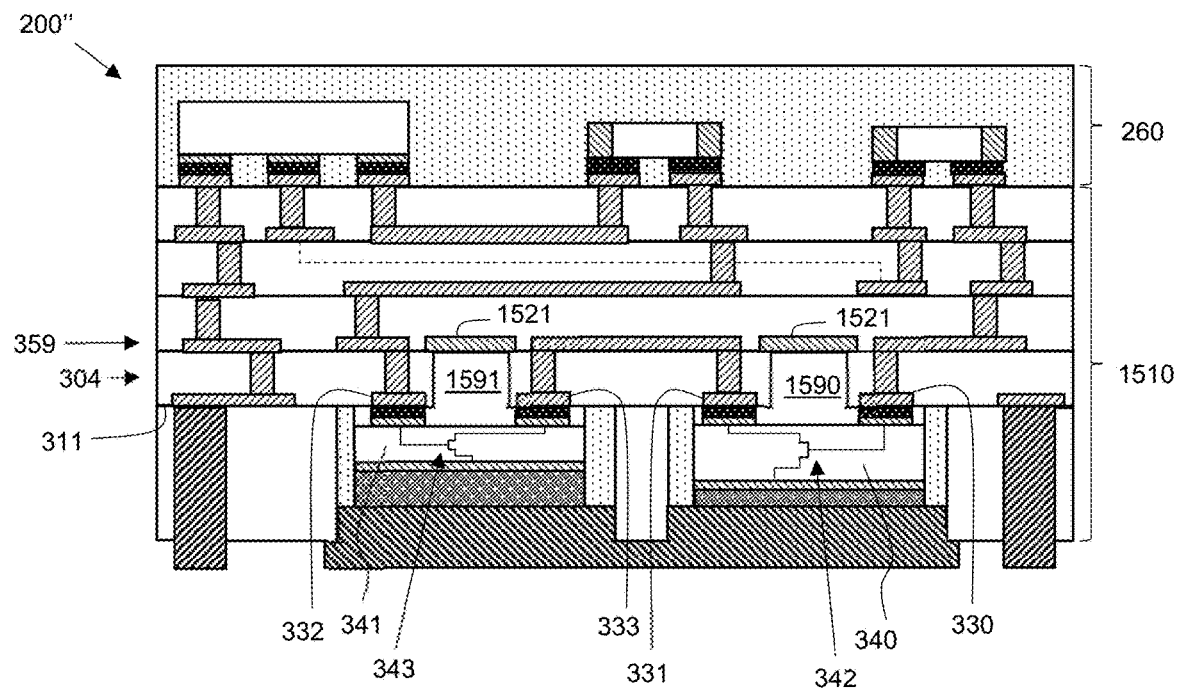
FIG. 15 is a side, cross-sectional view of another power amplifier device, according to another example embodiment.

Various modifications may be made to the power transistor devices 200, 200' while maintaining their function and unique aspects. For example, and as mentioned previously, the air cavities 390, 391 may be modified to extend through at least one but fewer than all of the multiple dielectric layers 301-304 of the substrate 210. FIG. 15 is a side, cross-sectional view of another power amplifier device 200" with air cavities 1590, 1591 that only partially extend through substrate 1510, according to another example embodiment. Except for the modified air cavities 1590, 1591, substrate 1510 is identical to substrate 210.

In device 200", each air cavity 1590, 1591 extends from substrate surface 311 through only one dielectric layer 304, with a cap 1521 located at the distal end of each air cavity 1590, 1591. The caps 1521 may be formed from portions of conductive layer 359, for example. In other embodiments, the air cavities may extend through more than one dielectric layer, with the distal end cap being formed from a portion of whichever patterned conductive layer corresponds to the distal end of the air cavity.

Other types of modifications also may be made to power transistor devices 200, 200', 200". For example, as will be discussed in conjunction with FIG. 16, rather than inserting the power transistor dies 340, 341 into openings in a substrate (e.g., openings 602 in substrate 210, FIG. 6), the power transistor dies 340, 341 instead could be coupled to a substrate surface and encapsulated.

Figure 16:
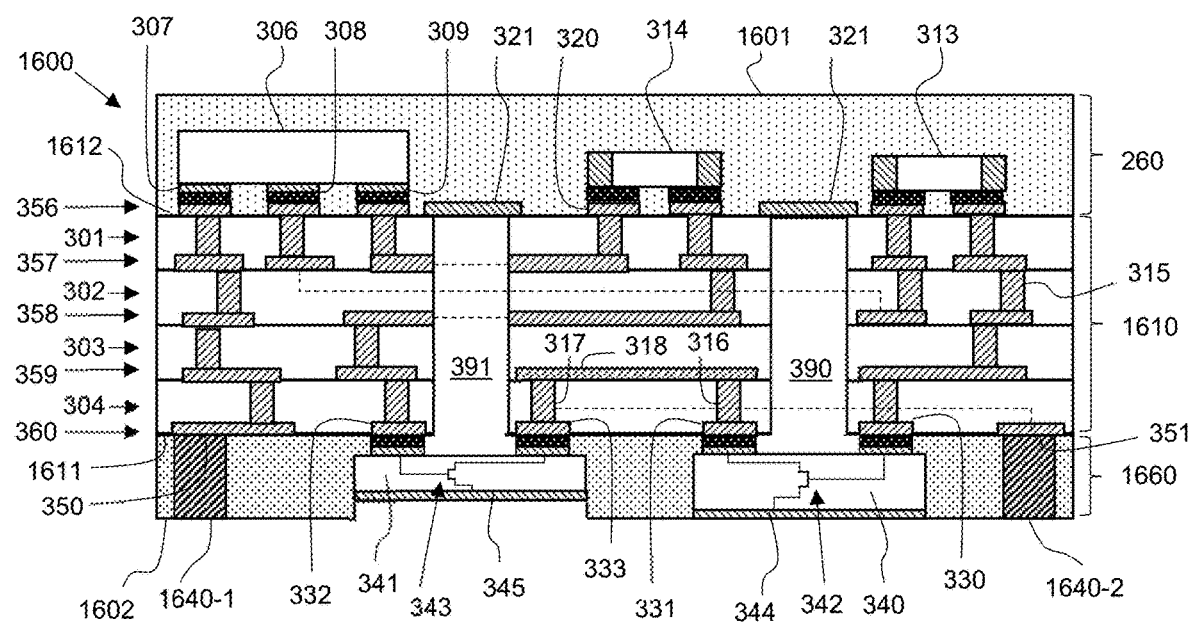
FIG. 16 is a side, cross-sectional view of yet another embodiment of a power amplifier device, according to another example embodiment.

Such an embodiment is shown in FIG. 16, which is a side, cross-sectional view of another example embodiment of a power amplifier device 1600. Power amplifier device 1600 is similar in many respects to power amplifier devices 200, 200', 200" (FIGS. 3, 14, 15), discussed above. Where elements in power amplifier device 1600 are substantially identical to elements in power amplifier devices 200, 200', 200" the same reference numbers will be used, and all details discussed above with respect to such elements apply equally to the same-numbered elements in FIG. 16. For purpose of brevity, all details will not be repeated here.

For power amplifier device 1600, the device body includes first and second encapsulation material layers 260, 1660 connected to opposite surfaces 1612, 1611 of a substrate 1610. The substrate 1610 is formed from a stack of multiple dielectric layers 301-304 and multiple patterned conductive layers 356-360 in an alternating arrangement. A plurality of conductive vias (e.g., via 315) electrically connect the patterned conductive layers 356-360. Substrate die contacts 330-333 and interconnect contacts 350, 351 are exposed at a first surface 1611 of the substrate 1610, and additional substrate contacts 320 are exposed at a second surface 1612 of the substrate 1610. In addition, the substrate 1610 includes air cavities 390, 391 that extend from substrate surface 1611 through dielectric layers 301-304, along with a conductive cap 321 at the distal end of each air cavity 390, 391.

According to an embodiment, one or more surface mount components 306, 313, 314 are connected to the additional substrate contacts 320 that are exposed at the second surface 1612 of the substrate 1610. A first encapsulation material layer 260 covers the surface mount components 306, 313, 314 and the second substrate surface 1612. The first encapsulation material layer 260 essentially defines the upper device surface 1601.

The surface mount components 306, 313, 314 can correspond to a number of components of an amplifier circuit. For example, at least one surface mount component 306 may correspond to a power divider circuit (e.g., power divider 106, FIG. 1), and additional surface mount components 313, 314 may correspond to portions of input impedance matching circuits (e.g., circuits 113, 114, FIG. 1) and/or harmonic termination circuits (e.g., circuits 116, 118, FIG. 1).

According to an embodiment, first and second power transistor dies 340, 341 are connected to the substrate die contacts 330-333, and thus are connected to the first substrate surface 1611. The first power transistor die 340 includes at least one integrated transistor 342 in an active area of die 340, and the second power transistor die 341 includes at least one additional integrated transistor 343 in an active area of die 341. Each power transistor includes a gate terminal, a drain terminal, and a source terminal. As can be seen in the cross-section of device 1600, the gate and drain terminals of each transistor 342, 343 are coupled to gate and drain contacts (not numbered) that are exposed at first die surfaces of the dies 340, 341. The gate and drain contacts, in turn, are coupled to (e.g., soldered to) the substrate die contacts 330-333. The source terminal of each transistor 342, 343 is coupled to a conductive bottom layer 344, 345 of each die 340, 341, and the conductive bottom layer 344, 345 defines a second die surface of each die 340, 341.

In addition to the power transistor dies 340, 341, the proximal ends of a plurality of conductive interconnects 1640-1, 1640-2 (e.g., analogous to interconnects 240, FIG. 2) are coupled to interconnect contacts 350, 351 at the first surface 1611 of the substrate. Similar to the conductive interconnects 240-1, 240-2 of FIG. 3, the conductive interconnects 1640-1, 1640-2 of the power transistor device 1600 are configured to convey RF signals, bias voltages, and ground connections to the amplifier circuitry (e.g., dies 340, 341 and surface mount components 306, 313, 314) embedded within the device 1600. In FIG. 16, conductive interconnect 1640-1 more specifically corresponds to an RF input terminal (e.g., terminal 102, FIG. 1), and conductive interconnect 1640-2 more specifically corresponds to an RF output terminal (e.g., terminal 104, FIG. 1).

In contrast with device 200 of FIG. 3, in which dies 340, 341 and interconnects 240-1, 240-2 are inserted into openings 602 in a substrate layer 305 (FIGS. 3, 6), power transistor device 1600 includes a second encapsulation material layer 1660 that covers the first surface 1611, sidewalls of the power transistor dies 340, 341 and sidewalls of the conductive interconnects 1640-1, 1640-2. The second encapsulation material layer 1660 essentially defines the lower device surface 1602. According to an embodiment, the conductive layers 344, 345 of the power transistor dies 340, 341 are exposed at the lower device surface 1602, as are the distal ends of the conductive interconnects 1640-1, 1640-2.

When an input RF signal is provided to interconnect 1640-1, the input RF signal may be conveyed through the substrate 1610 to the input terminal of the power divider circuit 306, and the power divider circuit 306 may perform the function of splitting the input RF signal into multiple (e.g., two or more) separate signals (e.g., a carrier signal and a peaking signal). The separate signals provided at the power divider outputs may then be conveyed through the substrate 1610 to the impedance matching components 313, 314 or directly to the inputs of the power transistor dies 340, 341.

Although not shown in the cross-section of FIG. 16, other conductive interconnects may be used to receive bias voltages, which may be conducted from the interconnects to the power transistor dies 340, 341 through the patterned conductive layers 356-360 and conductive vias of the substrate 1610. In addition, other conductive interconnects may be used to provide a ground reference (e.g., they may be coupled to ground when device 1600 is incorporated into a larger system). The ground connection between the ground interconnects and other circuit components (e.g., some of surface mount devices 306, 313, 314) may be made through the patterned conductive layers 356-360 and conductive vias of the substrate 1610.

Figure 17:
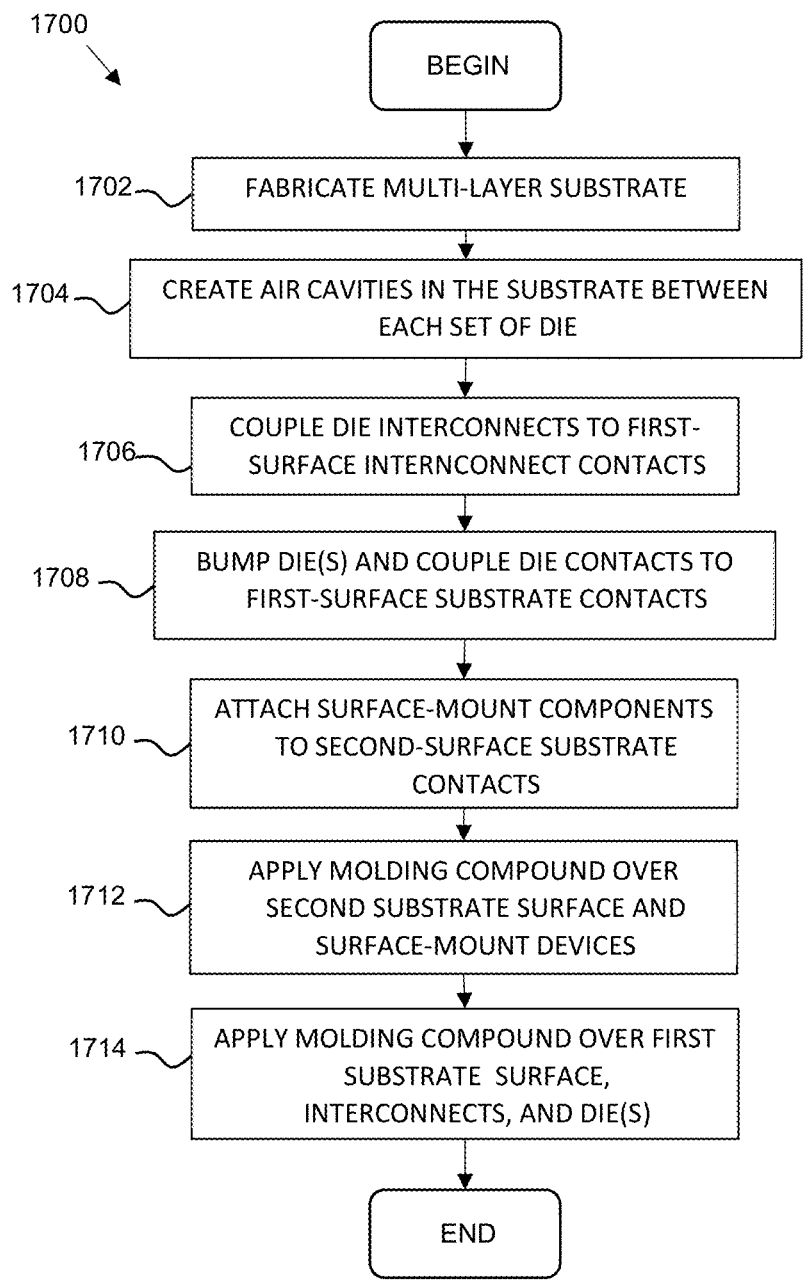
FIG. 17 is a flowchart of a method of manufacturing the power amplifier device of FIG. 16, according to an example embodiment.

FIG. 17 is a flowchart of a method 1700 of manufacturing the power amplifier device 1600 of FIG. 16, according to an example embodiment. For enhanced understanding, FIG. 17 should be viewed simultaneously with FIGS. 18 and 19, which are side, cross-sectional views of the power amplifier device 1600 of FIG. 16 at various stages of manufacture, according to an embodiment.

Figure 18:
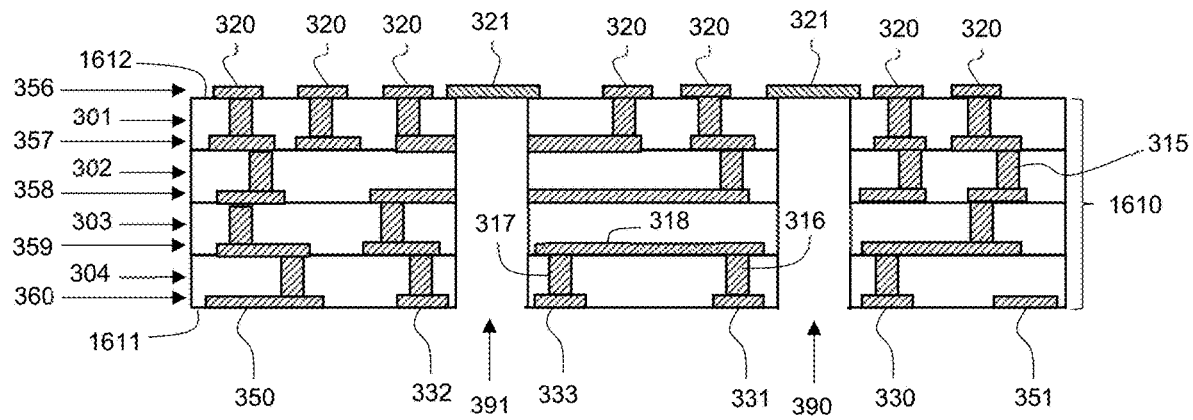
FIGS. 18-19 are side, cross-sectional views of the power amplifier device of FIG. 16 at various stages of manufacture, according to an embodiment.

Referring also to FIG. 18, the method begins, in step 1702, by fabricating a multi-layer substrate 1610. The substrate 1610 is formed from a stack of multiple dielectric layers 301-304 and multiple patterned conductive layers 356-360, which are built up in an alternating arrangement. The substrate 1610 is defined by a lower surface 1611, an upper surface 1612, and sidewalls extending between the lower and upper surfaces 1611, 1612. For example, the dielectric layers 301-304 may be formed from PCB dielectric materials (e.g., FR-4), ceramic, or other suitable dielectric materials. The patterned conductive layers 356-360 are formed from conductive metals, which are patterned during the build-up process. Also during the build-up process, conductive vias (e.g., vias 315-317) are formed through the dielectric layers in order to connect various portions of adjacent patterned conductive layers.

Various conductive paths within the substrate 1610 (formed from various combinations of conductive layer portions and conductive vias) will provide for interconnections between dies and components, which will later be mounted to the substrate 1610. In addition, some of the conductive paths within the substrate may be configured to provide desired inductances and impedance transformations. For example, a conductive path comprising vias 316, 317 and conductive layer portion 318 may form a phase delay and impedance inverter element (e.g., impedance inverter/phase delay element 184, FIG. 1).

It should be noted that, although substrate 1610 is shown to include four dielectric layers 301-304 and five conductive layers 356-360, other embodiments of a substrate may include more or fewer dielectric layers and/or conductive layers.

Once completed, the substrate 1610 includes substrate contacts 320, which are exposed at the upper surface 1612 of the substrate 1610. In addition, the substrate includes substrate die contacts 330-333 and interconnect contacts 350, 351 exposed at the lower surface 1611 of the substrate 1610.

With continued reference to FIG. 18, air cavities 390, 391 also are formed in the substrate in step 1704. The air cavities 390, 391 are formed in the substrate between each set of substrate contacts (e.g., within each of regions 890, 891, FIG. 8). According to an embodiment, the air cavities 390, 391 may be formed in regions 890, 891 using an etching process, which is timed to stop when the conductive caps 321 are reached. In an alternate embodiment, as indicated previously, the air cavity openings 390, 391 may be formed to extend all the way through the substrate 1610, and the conductive caps 321 can be attached over the air cavities 390, 391 thereafter.

Again, each of the first and second air cavities 390, 391 has a proximal end at the first substrate surface 1611, a distal end that is recessed within the substrate 1610 (and co-located with caps 321), and sidewalls extending between the proximal and distal ends. The proximal end of each air cavity 390, 391 is defined by an opening in the first substrate surface 1611. In addition, each air cavity opening (or the cross-section of each cavity 390, 391) has an area that is smaller than the die footprint (e.g., die footprint 840, 841), and that is equal to or smaller than the area of the first or second region 890, 891. According to an embodiment, each opening has an area that is at least one tenth of the size of the die footprint 840, 841 (e.g., from one tenth to one half of the die footprint size). In other embodiments, each opening may have an area that is at least one half of the size of the die footprint.

Figure 19:
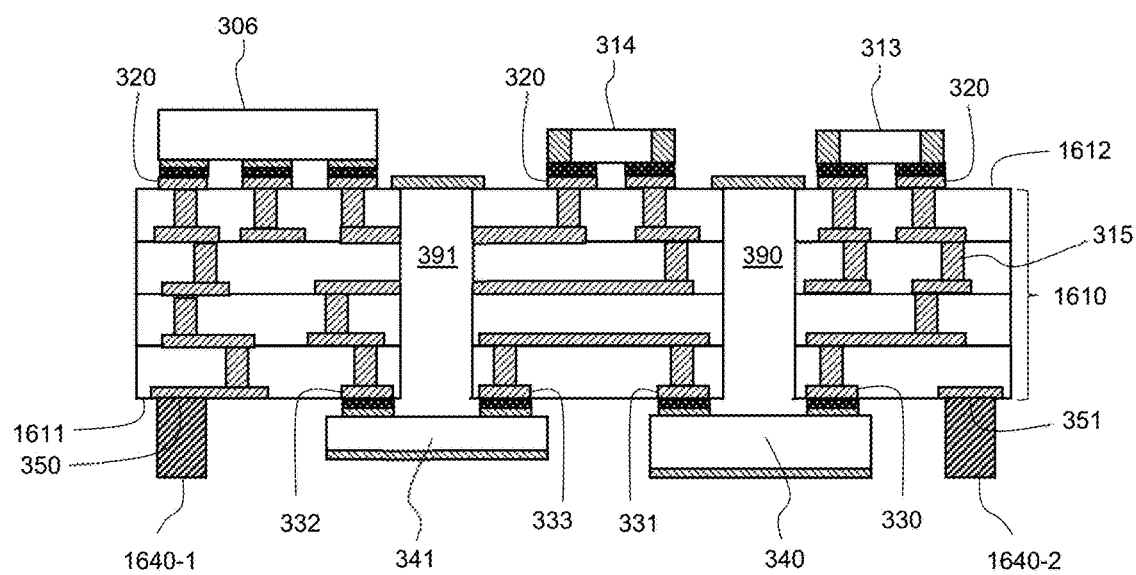

Referring now to FIG. 19, in step 1706, conductive interconnects 1640-1, 1640-2 (along with additional interconnects associated with bias, ground, and so on) are physically and electrically coupled to the interconnect contacts 350, 351 exposed at the lower surface 1611 of the substrate 1610. In one embodiment, the interconnect contacts 1640-1, 1640-2 are conductive posts that are soldered, brazed, or otherwise attached to the interconnect contacts 350, 351. In other embodiments, the interconnect contacts 1640-1, 1640-2 may be portions of a leadframe (not shown). In still other embodiments, multiple interconnects may be packaged side-by-side in one or more separate dielectric interposer structures (not shown), and the dielectric interposer structures may be coupled to the interconnect contacts 350, 351.

In step 1708, the power transistor dies 240, 241 are "bumped," by applying solder paste to the die bondpads (e.g., to the input and output, or gate and drain, bondpads). The die bondpads and the solder paste on the die bondpads are brought into contact with corresponding substrate die contacts 330-333. A solder reflow process may then be performed to solder-attach the die bondpads to the substrate die contacts 330-333.

In step 1710, the terminals of one or more surface mount components 306, 313, 314 are coupled (e.g., solder-attached) to the additional substrate contacts 320 that are exposed at substrate surface 1612. As discussed previously, the surface mount components 306, 313, 314 can correspond to a number of components of an amplifier circuit. For example, surface mount component 306 may correspond to a power divider circuit (e.g., power divider 106, FIG. 1), and surface mount components 313, 314 may correspond to capacitors, inductors, or other circuit elements associated with impedance matching, harmonic termination, and so on.

In step 1712, and referring again to FIG. 16, an encapsulation material layer 260 (e.g., molding compound) is applied over substrate surface 1612 and the surface-mount components 306, 313, 314 coupled to substrate surface 1612. The encapsulation material layer 260 defines the upper surface 1601 of the device 1600.

Finally, the device is completed, in step 1714, by applying another encapsulation material layer 1660 (e.g., molding compound) over substrate surface 1611, dies 340, 341, and interconnects 1640-1, 1640-2, according to an embodiment. The encapsulation material layer 1660 defines the lower surface 1602 of the device 1600. Desirably, once completed, the distal ends of interconnects 1640-1, 1640-2 and the conductive bottom layers 344, 345 of the dies 340, 341 are exposed at the lower surface 1602 of the device 1600. As discussed previously, the conductive layers 344, 345 that define the exposed outer surfaces of the dies 340, 341 may be electrically connected, within each die 340, 341, to a source terminal of a transistor embedded within the die 340, 341.

Figure 20:
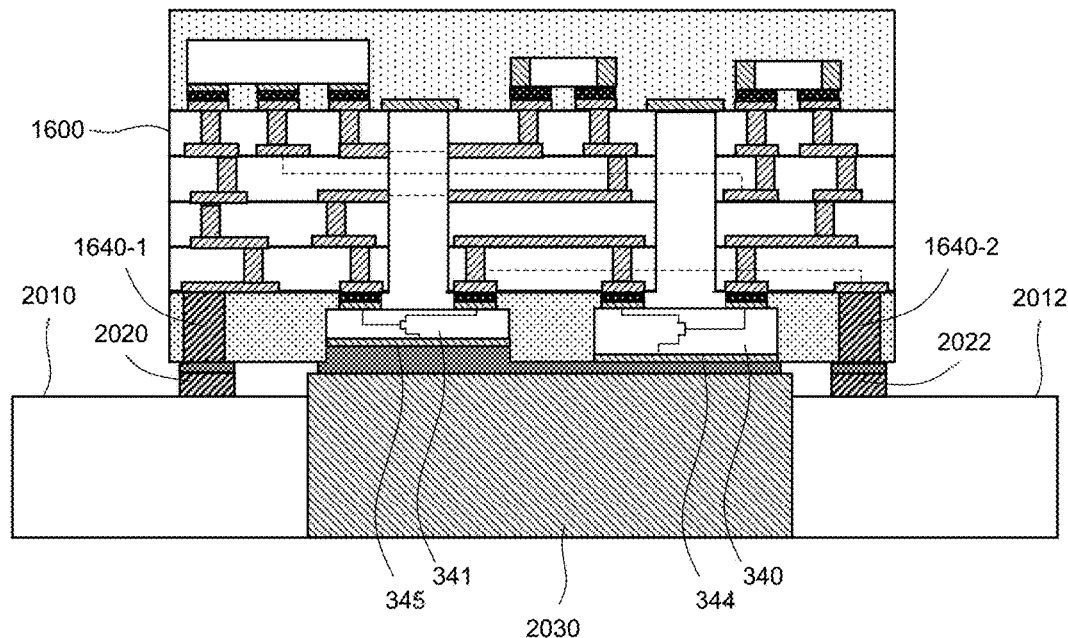
FIG. 20 is a side, cross-sectional view of the power amplifier device of FIG. 16 coupled to a system substrate with bottom-side heat extraction, according to an example embodiment.

The power amplifier device 1600 may then be incorporated into a larger system (e.g., a transmitter and/or communication system). For example, FIG. 20 is a side, cross-sectional view of the power amplifier device 1600 of FIG. 16 coupled to a system substrate 2010, according to an example embodiment. The system substrate 2010 may be, for example, a PCB with a plurality of contact pads 2020, 2022 at a top surface 2012. Although not shown in FIG. 20, the contact pads 2020, 2022 may be electrically coupled through additional traces on the substrate 2010 to other system components. According to an embodiment, a heat sink or heat extraction component 2030 (e.g., a conductive coin, thermal vias, or other thermally conductive component) is embedded within the system substrate 2010, and has an exposed upper surface proximate the top surface 2012 of the system substrate 2010.

Device 1600 is physically and electrically coupled to the system substrate 2010. More particularly, and according to an embodiment, the conductive surfaces 344, 345 of dies 340, 341 are physically, electrically, and thermally coupled to the heat extraction component 2030 of the system substrate 2010. For example, dies 340, 341 and heat extraction component 2030 may be coupled together using thermal grease, solder, sinter material, or brazing. Besides providing a pathway for extraction of heat, the heat extraction component 2030 also may be coupled to system ground, and thus the heat extraction component 2030 may serve as a system ground connection for device 1600.

In addition, the conductive interconnects 1640-1, 1640-2 (and other interconnects, not shown) are physically and electrically coupled (e.g., soldered) to the contact pads 2020, 2022 at the top surface 2012 of the system substrate 2010. Accordingly, the system substrate 2010 enables RF input signals to be provided to device 1600 (e.g., through contact pad 2020), RF output signals to be received from device 1600 (e.g., through contact pad 2022), and additional bias and ground connections to be established between the system substrate 2010 and the device 1600 through other substrate contact pads and device interconnects (not shown).

The embodiment of device 1600 depicted in FIGS. 16 and 20 provides for bottom-side cooling of device 1600. In a bottom-side cooled system, such as that depicted in FIG. 20, the heat extraction path for the dies 340, 341 within device 1600 extends through the system substrate 2010.

If device 1600 were slightly modified, it could instead be incorporated into a top-side cooled system. For example, FIG. 21 is a side, cross-sectional view of another embodiment of a power amplifier device 1600' coupled to a system substrate 2110 in a system with top-side heat extraction, according to an example embodiment.

Figure 21:
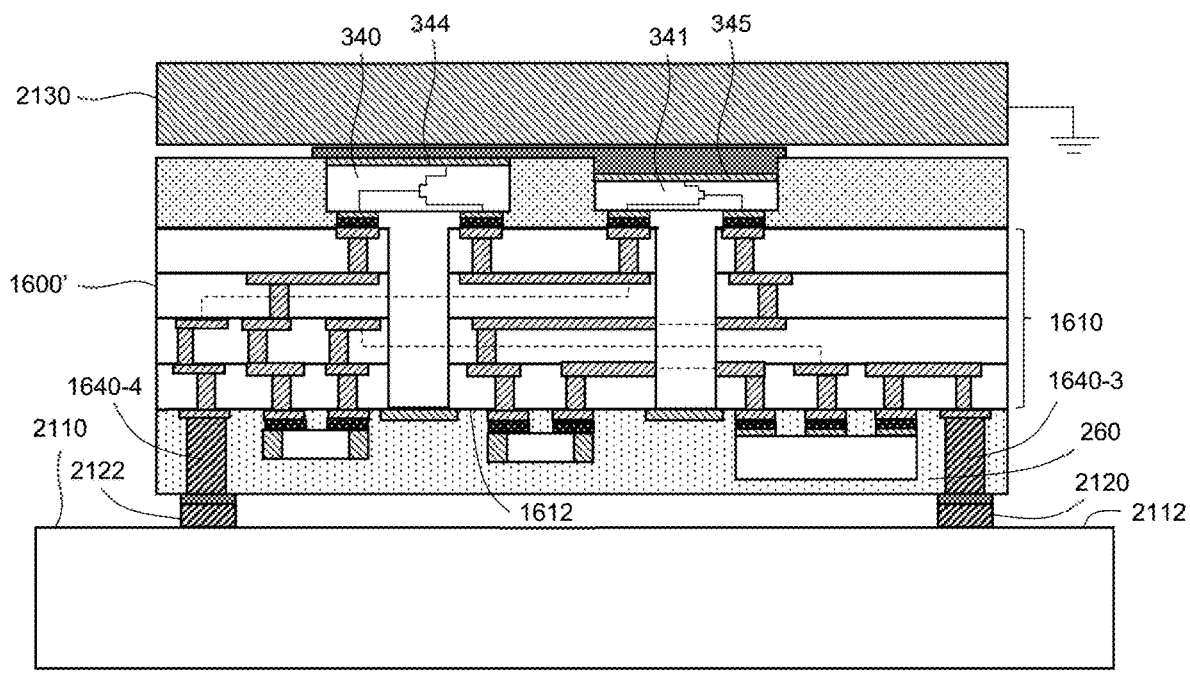
FIG. 21 is a side, cross-sectional view of another embodiment of a power amplifier device coupled to a system substrate with top-side heat extraction, according to an example embodiment.

Device 1600' shown in FIG. 21 is slightly different from device 1600 in FIGS. 16 and 20 to facilitate incorporation into a top-side cooled system. In particular, and referring to FIG. 16, device 1600 includes conductive interconnects 1640-1, 1640-2 coupled to contacts 350, 351 at surface 1611 of the device substrate 1610. Thus, the conductive interconnects 1640-1, 1640-2 and the conductive layers 344, 345 of the dies 340, 341 all are exposed at the lower surface 1602 of the device 1600.

In contrast, and referring to FIG. 21, in modified power amplifier device 1600', conductive interconnects 1640-3, 1640-4, which function as I/O terminals for the device 1600', instead are coupled to surface 1612 of device substrate 1610, and the interconnects 1640-3, 1640-4 extend through the encapsulation material layer 260 at the opposite surface of the device 1600' from the dies 340, 341. Additional conductive interconnects (not shown) for bias and ground connection also would extend through the encapsulation material layer 260. In other words, in device 1600', the conductive interconnects 1640-3, 1640-4 are exposed at an opposite surface of device 1600' than the surface at which the dies 340, 341 are exposed. The conductive interconnects 1640-3, 1640-4 are electrically coupled through the device substrate to the various dies 340, 341 and surface mount components 306, 313, 314 as discussed above in conjunction with FIG. 16.

Again, the system substrate 2110 may be, for example, a PCB with a plurality of contact pads 2120, 2122 at a top surface 2112. Although not shown in FIG. 21, the contact pads 2120, 2122 may be electrically coupled through additional traces on the substrate 2110 to other system components.

Device 1600' is physically and electrically coupled to the system substrate 2110. More particularly, and according to an embodiment, the conductive interconnects 1640-3, 1640-4 (and other interconnect, not shown) are physically and electrically coupled (e.g., soldered) to the contact pads 2120, 2122 at the top surface 2112 of the system substrate 2110. Accordingly, the system substrate 2110 enables RF input signals to be provided to device 1600' (e.g., through contact pad 2120), RF output signals to be received from device 1600' (e.g., through contact pad 2122), and additional bias and ground connections to be established between the system substrate 2110 and the device 1600' through other substrate contact pads and device interconnects (not shown).

In the orientation shown in FIG. 21, the conductive layers 344, 345 of dies 340, 341 are facing upward away from the system substrate 1610. According to an embodiment, a heat extraction component 2130 (e.g., a heat sink or conductive plate) is physically, electrically, and thermally coupled to the conductive layers 344, 345 of dies 340, 341. For example, conductive layers 344, 345 and heat extraction component 2130 may be coupled together using thermal grease, solder, sinter material, or brazing. Besides providing a pathway for extraction of heat, the heat extraction component 2130 also may be coupled to system ground, and thus the heat extraction component 2130 may serve as a system ground connection for device 1600'. In other embodiments, to ensure adequate RF grounding, other grounding structures may be implemented within device 1600' (e.g., by providing a conductive pathway through the substrate 1610 between conductive layers 344, 345 and a device terminal coupled to system ground), or on the exterior surface of device 1600' (e.g., by providing a conductive pathway extending along the sides of substrate 1610 and layer 260 that electrically couples layers 344, 345 to a ground contact on the system substrate 2110).

Figure 22:
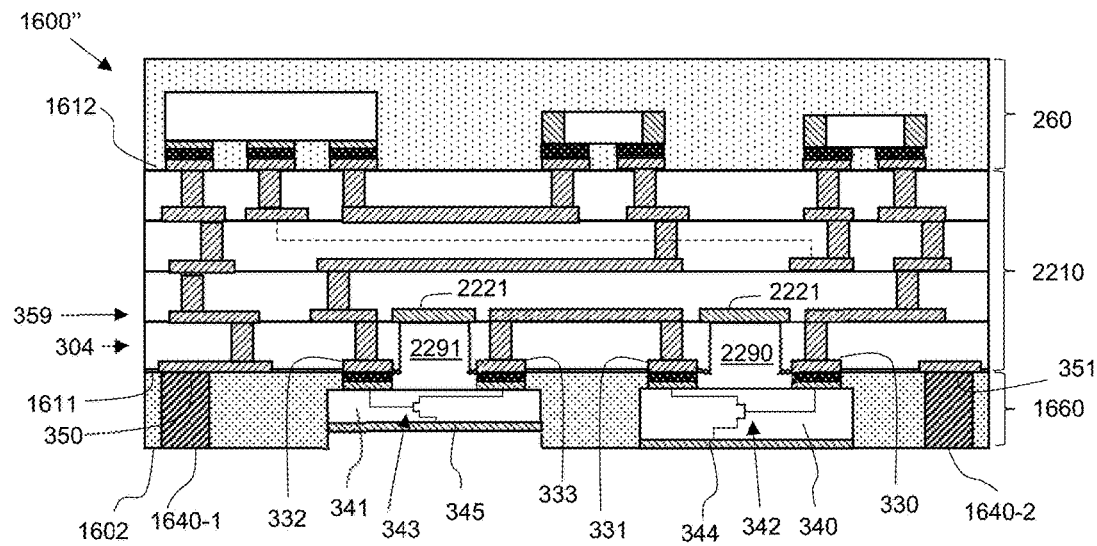
FIG. 22 is a side, cross-sectional view of yet another embodiment of a power amplifier device, according to another example embodiment.

Various modifications may be made to the power transistor devices 1600, 1600' while maintaining their function and unique aspects. For example, and as mentioned previously, the air cavities 390, 391 may be modified to extend through at least one but fewer than all of the multiple dielectric layers 301-304 of the substrate 1610. FIG. 22 is a side, cross-sectional view of another power amplifier device 1600" with air cavities 2290, 2291 that only partially extend through substrate 2210, according to another example embodiment. Except for the modified air cavities 2290, 2291, substrate 2210 is identical to substrate 1610.

In device 1600", each air cavity 2290, 2291 extends from substrate surface 1611 through only one dielectric layer 304, with a cap 2221 located at the distal end of each air cavity 2290, 2291. The caps 2221 may be formed from portions of conductive layer 359, for example. In other embodiments, the air cavities may extend through more than one dielectric layer, with the distal end cap being formed from a portion of whichever patterned conductive layer corresponds to the distal end of the air cavity.

The above-described embodiments of power amplifier devices 200, 200', 200", 1600, 1600', 1600" each have I/O and other terminals (e.g., conductive interconnects 240, 240-1, 240-2, 240-3, 240-4, 1640-1, 1640-2, 1640-3, 1640-4) that are exposed at an upper or lower surface of the device. In some cases, it may be desirable to have I/O and other terminals that extend from the side of a device, so that a lower portion of the device may be nested into an opening in a system substrate (e.g., a system PCB). Nesting a device in a system substrate in this manner enables bottom-side cooling easily to be implemented.

Figure 23:
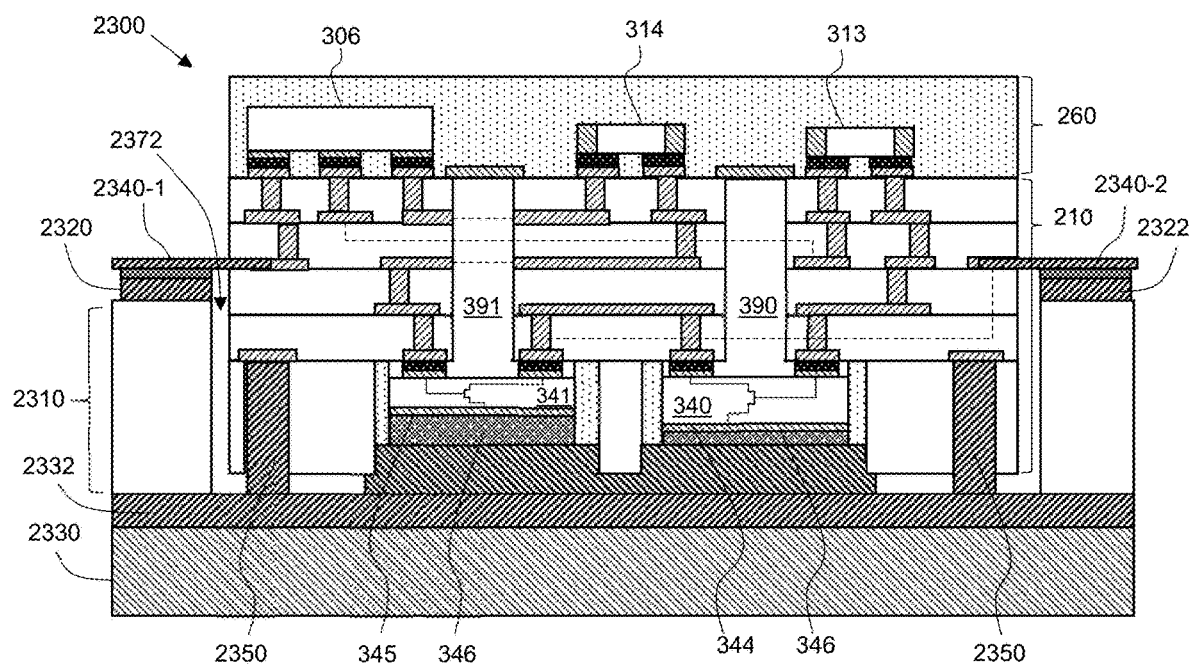
FIG. 23 is a side, cross-sectional view of yet another embodiment of a power amplifier device with side terminals, according to an example embodiment.

FIG. 23 is side, cross-sectional view of yet another embodiment of a power amplifier device 2300 with side terminals 2340-1, 2340-2 coupled to a system substrate 2310, according to an example embodiment. Power amplifier device 2300 is similar in many respects to power amplifier device 200 (FIG. 3), discussed above, except that various terminals of device 2300 extend from the sides of the device, rather than being exposed at the lower surface of the device. Where elements in power amplifier device 2300 are substantially identical to elements in power amplifier device 200, the same reference numbers will be used, and all details discussed above with respect to such elements apply equally to the same-numbered elements in FIG. 23. For purpose of brevity, all details will not be repeated here.

Portions of power amplifier device 2300 that are substantially the same as corresponding portions of power amplifier device 200 include device substrate 210, power transistor dies 340, 341 that are embedded in openings (e.g., openings 602, FIG. 6) in the device substrate 210, and surface mount components 306, 313, 314 that are embedded in encapsulant material layer 260.

Device 2300 also may include optional interconnects 2350, which also are embedded in the same side of the device 2300 as the dies 340, 341. These interconnects 2350 are similar to interconnects 240, 240-1, 240-2 (FIGS. 2, 3), in that they are electrically connected through the patterned conductive layers and vias of the substrate 210 to various components and circuits embedded in device 2300. However, unlike interconnects 240, 240-1, 240-2, which function as I/O, ground, and bias terminals, interconnects 2350 only provide for ground connections for the various components and circuits embedded within the device 2300.

In order to provide I/O and bias connections, device 2300 includes a plurality of side leads (e.g., terminals 2340-1, 2340-2), which extend perpendicularly from the sides of device 2300, and more particularly from the sides of device substrate 210. The leads 2340-1, 2340-2 are electrically coupled through the patterned conductive layers and vias of the device substrate 210 to the various dies 340, 341 and surface mount components 306, 313, 314.

According to an embodiment, each of the leads 2340-1, 2340-2 electrically connects to at least one conductive portion of one of the embedded conductive layers (e.g., any of layers 357-359, FIG. 3) of the device substrate 210. At least one lead (e.g., lead 2340-1) corresponds to the RF input for the amplifier device 2300 (e.g., input 102, FIG. 1), and at least one other lead (e.g., lead 2340-2) corresponds to the RF output for the amplifier device 2300 (e.g., output 104, FIG. 1). As shown in FIG. 23, for example, lead 2340-1 is electrically coupled through the patterned conductive layers and vias to surface mount device 306 (e.g., to the input terminal of a splitter), and lead 2340-2 is electrically coupled through the patterned conductive layers and vias (as indicated with a dashed line) to the drain terminal of power transistor die 341. As discussed above, the drain terminal of power transistor die 341 may correspond to the combining node of a Doherty amplifier, and thus lead 2340-2 is electrically coupled to the combining node.

To incorporate the device 2300 into a larger system, a lower half of the device 2300 is inserted into an opening 2372 in a system substrate 2310. Again, the system substrate 2310 may be, for example, a PCB with a plurality of contact pads 2320, 2322 at a top surface of the substrate 2310. Although not shown in FIG. 23, the contact pads 2320, 2322 may be electrically coupled through additional traces on the substrate 2310 to other system components. A thermal structure 2332 (e.g., a conductive coin or other structure) is brought into contact with the inserted surface of the device 2300, and is physically and electrically coupled to the device 2300 (e.g., with die attach, thermal grease, or other conductive material). Finally, a heat sink 2330 may be coupled to the thermal structure 2332.

Figure 24:
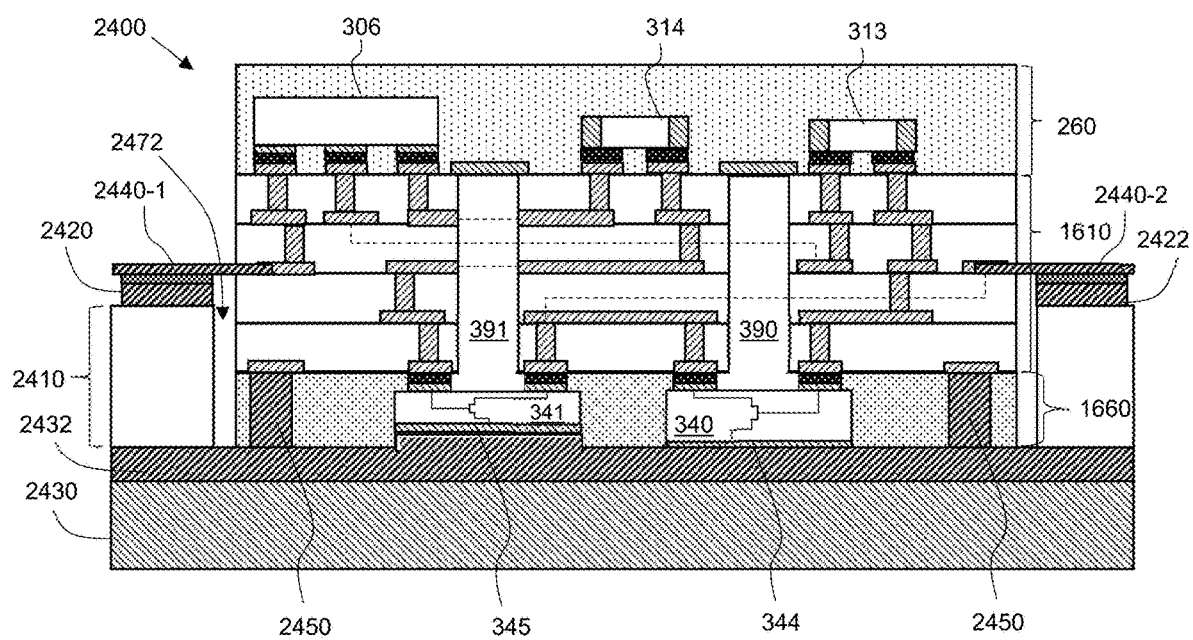
FIG. 24 is a side, cross-sectional view of yet another embodiment of a power amplifier device with side terminals, according to another example embodiment.

FIG. 24 is side, cross-sectional view of yet another embodiment of a power amplifier device 2400 with side terminals 2440-1, 2440-2 coupled to a system substrate 2410, according to another example embodiment. Power amplifier device 2400 is similar in many respects to power amplifier device 1600 (FIG. 16), discussed above, except that various terminals of device 2400 extend from the sides of the device, rather than being exposed at the lower surface of the device. Where elements in power amplifier device 2400 are substantially identical to elements in power amplifier device 1600, the same reference numbers will be used, and all details discussed above with respect to such elements apply equally to the same-numbered elements in FIG. 24. For purpose of brevity, all details will not be repeated here.

Portions of power amplifier device 2400 that are substantially the same as corresponding portions of power amplifier device 1600 include device substrate 1610, power transistor dies 340, 341 that are embedded in a first encapsulant material layer 1660, and surface mount components 306, 313, 314 that are embedded in a second encapsulant material layer 260.

Device 2400 also may include optional interconnects 2450, which also are embedded in the first encapsulant material layer 1660. These interconnects 2450 are similar to interconnects 1640-1, 1640-2 (FIG. 16), in that they are electrically connected through the patterned conductive layers and vias of the substrate 1610 to various components and circuits embedded in device 2400. However, unlike interconnects 1640-1, 1640-2, which function as I/O, ground, and bias terminals, interconnects 2450 only provide for ground connections for the various components and circuits embedded within the device 2400.

In order to provide I/O and bias connections, device 2400 includes a plurality of side leads (e.g., leads 2440-1, 2440-2), which extend perpendicularly from the sides of device 2400, and more particularly from the sides of device substrate 1610. The leads 2440-1, 2440-2 are electrically coupled through the patterned conductive layers and vias of the device substrate 1610 to the various dies 340, 341 and surface mount components 306, 313, 314.

According to an embodiment, each of the leads 2440-1, 2440-2 electrically connects to at least one conductive portion of one of the embedded conductive layers (e.g., any of layers 357-359, FIG. 16) of the device substrate 1610. At least one lead (e.g., lead 2440-1) corresponds to the RF input for the amplifier device 2400 (e.g., input 102, FIG. 1), and at least one other lead (e.g., lead 2440-2) corresponds to the RF output for the amplifier device 2400 (e.g., output 104, FIG. 1). As shown in FIG. 24, for example, lead 2440-1 is electrically coupled through the patterned conductive layers and vias to surface mount device 306 (e.g., to the input terminal of a splitter), and lead 2440-2 is electrically coupled through the patterned conductive layers and vias (as indicated with a dashed line) to the drain terminal of power transistor die 341. As discussed above, the drain terminal of power transistor die 341 may correspond to the combining node of a Doherty amplifier, and thus lead 2440-2 is electrically coupled to the combining node.

To incorporate the device 2400 into a larger system, a lower half of the device 2400 is inserted into an opening 2472 in a system substrate 2410. Again, the system substrate 2410 may be, for example, a PCB with a plurality of contact pads 2420, 2422 at a top surface of the substrate 2410. Although not shown in FIG. 24, the contact pads 2420, 2422 may be electrically coupled through additional traces on the substrate 2410 to other system components. A thermal structure 2432 (e.g., a conductive coin or other structure) is brought into contact with the inserted surface of the device 2400, and is physically and electrically coupled to the exposed conductive layers 344, 345 of the dies 340, 341 with conductive die attach. Finally, a heat sink 2430 may be coupled to the thermal structure 2432.

An embodiment of a power amplifier device includes a substrate formed from a stack of alternating dielectric and patterned conductive layers and conductive vias electrically connecting the patterned conductive layers. The substrate has a set of substrate die contacts exposed at a first substrate surface, and an air cavity extending into the substrate through a portion of the first substrate surface that is located between the set of substrate die contacts. A power transistor die has first and second die contacts at a first die surface, which are connected to the substrate die contacts. The power transistor die also includes an integrated transistor in an active area of the die. The integrated transistor includes a control terminal coupled to the first die contact, and a first current conducting terminal coupled to the second die contact. The active area is aligned with the first air cavity.

An embodiment of an amplifier system includes a system substrate and a power amplifier device coupled to the system substrate. The power amplifier device includes a substrate formed from a stack of alternating dielectric and patterned conductive layers and conductive vias electrically connecting the patterned conductive layers. The substrate has a set of substrate die contacts exposed at a first substrate surface, and an air cavity extending into the substrate through a portion of the first substrate surface that is located between the set of substrate die contacts. A power transistor die has first and second die contacts at a first die surface, which are connected to the substrate die contacts. The power transistor die also includes an integrated transistor in an active area of the die. The integrated transistor includes a control terminal coupled to the first die contact, and a first current conducting terminal coupled to the second die contact. The active area is aligned with the first air cavity.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier device with a first device surface and an opposed second device surface, the power amplifier device comprising:
    a substrate formed from a stack of multiple dielectric layers and multiple patterned conductive layers in an alternating arrangement, and a plurality of conductive vias electrically connecting the patterned conductive layers, wherein the substrate has a first substrate surface, an opposed second substrate surface, a first set of substrate die contacts exposed at the first substrate surface, and a first region defined as a portion of the first substrate surface located between the first set of substrate die contacts;
    a first air cavity extending into the substrate through the first region, wherein the first air cavity has a proximal end at the first substrate surface; and
    a first power transistor die with a first die surface and an opposed second die surface and including
        first and second die contacts at the first die surface and connected to first and second substrate die contacts, respectively, of the first set of substrate die contacts, and
        at least one integrated transistor in an active area of the first power transistor die, wherein the at least one integrated transistor includes a control terminal coupled to the first die contact, and a first current conducting terminal coupled to the second die contact, and wherein the active area is aligned with the first air cavity.

2. The power amplifier device of claim 1, further comprising:
a metal cap at a distal end of the first air cavity.

3. The power amplifier device of claim 1, wherein the proximal end of the first air cavity is defined by an opening in the first substrate surface, and the opening has an area that is at least one half of a size of a footprint of the first power transistor die.

4. The power amplifier device of claim 1, wherein the first air cavity extends from the first substrate surface through all of the multiple dielectric layers.

5. The power amplifier device of claim 1, wherein the first air cavity extends from the first substrate surface through at least one but fewer than all of the multiple dielectric layers.

6. The power amplifier device of claim 1, wherein an outermost dielectric layer of the multiple dielectric layers partially defines the first substrate surface, and the first set of substrate die contacts is exposed through an opening in the outermost dielectric layer.

7. The power amplifier device of claim 6, further comprising:
a first conductive interconnect extending through the outermost dielectric layer and having a first end exposed at the first substrate surface and a second end electrically coupled to the multiple patterned conductive layers, and wherein the first conductive interconnect is electrically coupled to the control terminal; and
a second conductive interconnect extending through the outermost dielectric layer and having a first end exposed at the first substrate surface and a second end electrically coupled to the multiple patterned conductive layers, and wherein the second conductive interconnect is electrically coupled to the first current conducting terminal.

8. The power amplifier device of claim 1, wherein:
the substrate further includes a plurality of additional substrate contacts exposed at the second substrate surface; and
the power amplifier device further includes
one or more surface-mount components connected to the plurality of additional substrate components at the second substrate surface, wherein the one or more surface-mount components are electrically coupled through the patterned conductive layers and the conductive vias to the first and second die contacts, and
an encapsulation material layer covering the one or more surface-mount components and the second substrate surface, wherein the encapsulation material layer defines the second device surface of the power amplifier device.

9. The power amplifier device of claim 8, further comprising:
a first conductive interconnect extending through the encapsulation material layer and having a first end exposed at the second substrate surface and a second end electrically coupled to the multiple patterned conductive layers, and wherein the first conductive interconnect is electrically coupled to the control terminal; and
a second conductive interconnect extending through the encapsulation material layer and having a first end exposed at the second substrate surface and a second end electrically coupled to the multiple patterned conductive layers, and wherein the second conductive interconnect is electrically coupled to the first current conducting terminal.

10. The power amplifier device of claim 8, wherein the one or more surface mount components form portions of amplifier circuitry selected from pre-amplifier transistors, power splitting circuitry, harmonic termination circuitry, inductors, capacitors, and impedance matching circuitry.

11. The power amplifier device of claim 1, further comprising:
a first side terminal extending from a first side of the substrate and having a first end that is exposed and a second end electrically coupled to the multiple patterned conductive layers, and wherein the first side terminal is electrically coupled to the control terminal; and
a second side terminal extending from a second side of the substrate and having a first end that is exposed and a second end electrically coupled to the multiple patterned conductive layers, and wherein the second side terminal is electrically coupled to the first current conducting terminal.

12. The power amplifier device of claim 1, wherein:
the first power transistor die further comprises a third die contact at the second die surface, wherein the third die contact comprises a conductive layer at the second die surface; and
the power amplifier device further comprises a thermal structure coupled to the conductive layer with a die attach material.

13. The power amplifier device of claim 1, wherein:
the first and second substrate contacts are located at the first substrate surface, and
the power amplifier device further includes
an encapsulation material layer covering the first power transistor die and the first substrate surface, wherein the encapsulation material layer defines the first surface of the power amplifier device.

14. The power amplifier device of claim 13, further comprising:
a first conductive interconnect extending through the encapsulation material layer and having a first end exposed at the first substrate surface and a second end electrically coupled to the multiple patterned conductive layers, and wherein the first conductive interconnect is electrically coupled to the control terminal; and
a second conductive interconnect extending through the encapsulation material layer and having a first end exposed at the first substrate surface and a second end electrically coupled to the multiple patterned conductive layers, and wherein the second conductive interconnect is electrically coupled to the first current conducting terminal.

15. The power amplifier device of claim 1, further comprising:
a second set of substrate die contacts exposed at the first substrate surface, and a second region defined as a portion of the substrate located between the second set of substrate die contacts;
a second power transistor die with a third die surface and an opposed fourth die surface and including
third and fourth die contacts at the third die surface and connected to third and fourth substrate contacts, respectively, of the second set of substrate die contacts, and at least one additional integrated transistor in an active area of the second power transistor die, wherein the at least one additional integrated transistor includes a control terminal coupled to the third die contact, and a first current conducting terminal coupled to the fourth die contact; and, a second air cavity extending into the substrate through the second region of the substrate, wherein the second air cavity has a proximal end aligned with the active area of the second power transistor die.

16. The power amplifier device of claim 15, wherein the first and second power transistor die comprise a carrier amplifier die and a peaking amplifier die of a Doherty power amplifier.

17. An amplifier system comprising:

a system substrate; and a power amplifier device coupled to the system substrate, wherein the power amplifier device includes a first device surface, an opposed second device surface, a substrate formed from a stack of multiple dielectric layers and multiple patterned conductive layers in an alternating arrangement, and a plurality of conductive vias electrically connecting the patterned conductive layers, wherein the substrate has a first substrate surface, an opposed second substrate surface, a first set of substrate die contacts exposed at the first substrate surface, and a first region defined as a portion of the first substrate surface located between the first set of substrate die contacts, a first air cavity extending into the substrate through the first region, wherein the first air cavity has a proximal end at the first substrate surface, and a first power transistor die with a first die surface and an opposed second die surface and including first and second die contacts at the first die surface and connected to first and second substrate die contacts, respectively, of the first set of substrate die contacts, and at least one integrated transistor in an active area of the first power transistor die, wherein the at least one integrated transistor includes a control terminal coupled to the first die contact, and a first current conducting terminal coupled to the second die contact, and wherein the active area is aligned with the first air cavity.

18. The amplifier system of claim 17, further comprising: a metal cap at a distal end of the first air cavity.

19. The amplifier system of claim 17, wherein the proximal end of the first air cavity is defined by an opening in the first substrate surface, and the opening has an area that is at least one half of a size of a footprint of the first power transistor die.

20. The amplifier system of claim 17, wherein the first air cavity extends from the first substrate surface through all of the multiple dielectric layers.

21. The amplifier system of claim 17, wherein the first air cavity extends from the first substrate surface through at least one but fewer than all of the multiple dielectric layers.

* * * * *